US009207949B2

(12) United States Patent
Lee et al.

(10) Patent No.: US 9,207,949 B2
(45) Date of Patent: Dec. 8, 2015

(54) STORAGE DEVICE COMPRISING VARIABLE RESISTANCE MEMORY AND RELATED METHOD OF OPERATION

(71) Applicants: Wonseok Lee, Suwon-Si (KR); Seonghyun Jeon, Seoul (KR); Dong-Hwi Kim, Yongin-si (KR)

(72) Inventors: Wonseok Lee, Suwon-Si (KR); Seonghyun Jeon, Seoul (KR); Dong-Hwi Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 257 days.

(21) Appl. No.: 13/951,493

(22) Filed: Jul. 26, 2013

(65) Prior Publication Data

US 2014/0032890 A1  Jan. 30, 2014

(30) Foreign Application Priority Data

Jul. 26, 2012  (KR) ......................... 10-2012-0081552

(51) Int. Cl.
| | |
|---|---|
| G06F 9/00 | (2006.01) |
| G06F 9/44 | (2006.01) |
| G11C 7/20 | (2006.01) |
| G11C 29/02 | (2006.01) |
| G11C 29/04 | (2006.01) |
| G11C 29/44 | (2006.01) |
| G11C 11/16 | (2006.01) |
| G11C 13/00 | (2006.01) |

(52) U.S. Cl.
CPC ............... G06F 9/4401 (2013.01); G11C 7/20 (2013.01); G11C 29/028 (2013.01); G11C 11/1673 (2013.01); G11C 13/004 (2013.01); G11C 2029/0407 (2013.01); G11C 2029/4402 (2013.01)

(58) Field of Classification Search
USPC .......................................... 713/1, 2
See application file for complete search history.

(56) References Cited

U.S. PATENT DOCUMENTS

| | | | |
|---|---|---|---|
| 6,073,232 A * | 6/2000 | Kroeker et al. ................... 713/1 |
| 6,473,853 B1 | 10/2002 | Spiegel et al. | |
| 7,441,102 B2 | 10/2008 | Shade | |
| 7,702,057 B2 | 4/2010 | Sidiropoulos | |
| 8,417,928 B2 * | 4/2013 | Zhao et al. ......................... 713/2 |
| 8,766,707 B1 * | 7/2014 | Younger et al. ............... 327/534 |
| 2003/0005223 A1 * | 1/2003 | Coulson et al. ............... 711/118 |
| 2003/0142561 A1 * | 7/2003 | Mason et al. ................. 365/200 |
| 2004/0039872 A1 * | 2/2004 | Takamizawa et al. ........ 711/103 |
| 2004/0225874 A1 * | 11/2004 | Burr et al. ......................... 713/1 |
| 2006/0242398 A1 | 10/2006 | Fontijn et al. | |
| 2007/0091707 A1 | 4/2007 | Hidaka | |

(Continued)

FOREIGN PATENT DOCUMENTS

| | | | |
|---|---|---|---|
| JP | 2005011120 A | 1/2005 |
| JP | 2007109008 A | 4/2007 |

(Continued)

Primary Examiner — Vincent Tran
(74) Attorney, Agent, or Firm — Volentine & Whitt, PLLC

(57) ABSTRACT

A storage device includes a nonvolatile memory device including a variable resistance memory, and a controller configured to control the nonvolatile memory device. At a booting operation, the controller stores booting information in the variable resistance memory of the nonvolatile memory device. At a rebooting operation, the controller selectively performs a warm boot operation using the booting information stored in the variable resistance memory, based on a comparison result between a booting setting condition associated with the booting operation and a rebooting condition associated with the rebooting operation.

27 Claims, 23 Drawing Sheets

(56) References Cited

U.S. PATENT DOCUMENTS

| | | |
|---|---|---|
| 2007/0140033 A1 | 6/2007 | Yang et al. |
| 2008/0082808 A1* | 4/2008 | Rothman et al. ............... 713/1 |
| 2009/0129141 A1 | 5/2009 | Hosotani et al. |
| 2010/0115258 A1* | 5/2010 | Jeon et al. ..................... 713/2 |
| 2010/0151919 A1 | 6/2010 | Caskey |
| 2010/0153628 A1* | 6/2010 | Jang et al. ................. 711/103 |
| 2010/0214813 A1 | 8/2010 | Choi et al. |
| 2011/0188298 A1 | 8/2011 | Suzuki et al. |
| 2012/0004011 A1 | 1/2012 | Chun |
| 2013/0262792 A1* | 10/2013 | Barth et al. ................. 711/154 |

FOREIGN PATENT DOCUMENTS

| | | |
|---|---|---|
| JP | 2007172819 A | 7/2007 |
| KR | 1020090052815 A | 5/2009 |
| KR | 1020100097454 A | 9/2010 |
| WO | 2011117251 A1 | 9/2011 |

* cited by examiner

STORAGE DEVICE COMPRISING VARIABLE RESISTANCE MEMORY AND RELATED METHOD OF OPERATION

CROSS-REFERENCE TO RELATED APPLICATIONS

A claim for priority under 35 U.S.C. §119 is made to Korean Patent Application No. 10-2012-0081552 filed Jul. 26, 2012, in the Korean Intellectual Property Office, the entire contents of which are hereby incorporated by reference.

BACKGROUND

The inventive concepts described herein relate to a storage device including a variable resistance memory and to a method of operating a storage device including a variable resistance memory.

A semiconductor memory device is a memory device which is fabricated using semiconductors such as silicon (Si), germanium (Ge), gallium arsenide (GaAs), indium phosphide (InP), and the like. Semiconductor memory devices are generally classified as either volatile memory devices or nonvolatile memory devices.

The volatile memory devices are characterized by the loss of stored contents at a power-off condition. Examples of volatile memory devices include certain types of random access memory (RAM) such as a static RAM (SRAM), a dynamic RAM (DRAM), a synchronous DRAM (SDRAM), and the like. In contrast, nonvolatile memory devices are characterized by the retention of stored contents even during power-off condition. Examples of nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

SUMMARY

Example embodiments of the inventive concept provide a storage device which includes a nonvolatile memory device including a variable resistance memory, and a controller configured to control the nonvolatile memory device. At a booting operation, the controller stores booting information in the variable resistance memory of the nonvolatile memory device. At a rebooting operation, the controller selectively performs a warm boot operation using the booting information stored in the variable resistance memory, based on a comparison result between a booting setting condition associated with the booting operation and a rebooting condition associated with the rebooting operation.

In example embodiments, In example embodiments, the controller includes a condition sensing unit configured to sense information of the booting setting condition associated with the booting operation, and to sense information of the rebooting condition associated with the rebooting operation.

In example embodiments, the controller further includes a decision unit configured to compare the booting setting condition and the rebooting condition, and to determine whether to perform the warm boot operation according to the comparison result.

In example embodiments, when the booting setting condition and the rebooting condition are contained within a predetermined error range, the decision unit controls the nonvolatile memory device to perform the warm boot operation using the booting information stored in the variable resistance memory.

In example embodiments, the decision unit updates the booting information when the booting setting condition and the rebooting condition are not contained within the predetermined error range, and controls the nonvolatile memory device such that the booting information of the variable resistance memory is overwritten by the updated booting information.

In example embodiments, the booting setting condition is stored in the variable resistance memory at the booting operation, and at the rebooting operation, when the booting setting condition and the rebooting condition are not within the predetermined error range, the decision unit controls the nonvolatile memory device such that the booting setting condition stored at the variable resistance memory is overwritten by the rebooting condition.

In example embodiments, the condition sensing unit comprises a temperature sensor sensing information associated with a temperature at the booting operation, a timer checking information associated with a time at the booting operation, and a voltage sensor sensing information associated with a voltage at the booting operation.

In example embodiments, the nonvolatile memory device further comprises a mode register set to store MRS information, and at the booting operation, the controller stores the MRS information at the mode register set and the variable resistance memory when the booting information is set.

In example embodiments, the nonvolatile memory device further comprises control logic to control the mode register set and the variable resistance memory, and the control logic transfers the MRS information stored at the variable resistance memory to the mode register set when the warm boot operation is performed.

In example embodiments, the nonvolatile memory device further comprises a DLL circuit configured to perform a DLL locking operation at the booting operation, and control logic configured to control the variable resistance memory and the DLL circuit, and after the DLL locking operation is completed, the control logic stores information associated with a DLL locking result at the variable resistance memory.

In example embodiments, the control logic transfers information associated with the DLL locking result stored at the variable resistance memory to the DLL circuit when the warm boot operation is performed.

In example embodiments, controller comprises command/address (C/A) training test logic configured to perform a C/A training operation at the booting operation, and a register configured to store a C/A training result after the C/A training operation is completed.

In example embodiments, the controller stores the C/A training result at the variable resistance memory.

In example embodiments, the controller sends the C/A training result stored at the variable resistance memory to the register when the warm boot operation is performed.

In example embodiments, the controller comprises input/output data (DQ) calibration test logic configured to perform a DQ calibration operation at the booting operation, and a register configured to store a DQ calibration result after the DQ calibration operation is completed.

In example embodiments, the controller stores the DQ calibration result at the variable resistance memory.

In example embodiments, the controller sends the DQ calibration result stored at the variable resistance memory to the register when the warm boot operation is performed.

In example embodiments, the nonvolatile memory device further comprises a flash memory, and the variable resistance memory stores the booting information and the flash memory stores user data.

In example embodiments, the nonvolatile memory device further comprises a plurality of flash memories, and the variable resistance memory is connected with the controller via a first channel and the plurality of flash memories is connected with the controller via at least one second channel that is different from the first channel.

In example embodiments, the variable resistance memory is an magneto resistive random access memory (MRAM).

Example embodiments of the inventive concept also provide a storage device a nonvolatile memory device configured to store user data, and a controller configured to control the nonvolatile memory device and including a variable resistance memory. At a booting operation, booting information and a booting setting condition are stored in the variable resistance memory of the controller. At a rebooting operation, the controller selectively performs a warm boot operation using the booting information stored in the variable resistance memory, based on a comparison result between a rebooting condition detected at the rebooting operation and the booting setting condition stored at the booting operation.

In example embodiments, In example embodiments, the controller further comprises a condition sensing unit configured to sense the booting setting condition at the booting operation and to sense the rebooting condition at the rebooting operation, and a decision unit configured to compare the booting setting condition and the rebooting condition.

In example embodiments, the nonvolatile memory device includes a flash memory, and the variable resistance memory of the controller includes an magneto resistive random access memory (MRAM). In addition, the controller further comprises a host interface configured to interface with a host, a flash memory interface configured to interface with the flash memory, and a dynamic random access memory (DRAM) interface configured to provide an interface between the decision unit and the MRAM according to a DRAM interface protocol.

In example embodiments, the booting information is at least one of mode register set (MRS) information, delayed locked loop (DLL) locking information, command/address (C/A) training information, or input/output data (DQ) calibration information.

Example embodiments of the inventive concept also provide an operating method of a storage device which includes a variable resistance memory. The operating method includes detecting a rebooting condition corresponding to a rebooting operation, comparing the rebooting condition with a booting setting condition stored in the variable resistance memory, the booting setting condition corresponding to a booting operation executed before the rebooting operation. The operating method further includes utilizing booting information, set in the variable resistance memory during the booting operation, at the rebooting operation when the rebooting condition and the booting setting condition are contained within a predetermined error range.

In example embodiments, In example embodiments, the comparing the rebooting condition with a booting setting condition comprises comparing one of temperature information, voltage information, and time information at the rebooting operation with one of temperature information, voltage information, and time information at the booting operation.

In example embodiments, the utilizing booting information comprises reading mode register set (MRS) setting information from the variable resistance memory, and storing the read MRS setting information at a mode register set.

In example embodiments, the utilizing booting information comprises reading delayed lock loop (DLL) locking information from the variable resistance memory, and sending the read DLL locking information to a DLL circuit.

In example embodiments, the utilizing booting information comprises reading a command/address (C/A) training code from the variable resistance memory, storing the read C/A training code at a register corresponding to C/A training test logic.

In example embodiments, the utilizing booting information comprises reading an input/output data (DQ) calibration code from the variable resistance memory, and storing the read DQ calibration code at a second register corresponding to DQ calibration test logic.

BRIEF DESCRIPTION OF THE FIGURES

The above and other objects and features will become apparent from the description that follows with reference to the accompanying figures, wherein like reference numbers refer to like parts throughout the various figures unless otherwise specified.

DETAILED DESCRIPTION

Figure 1:
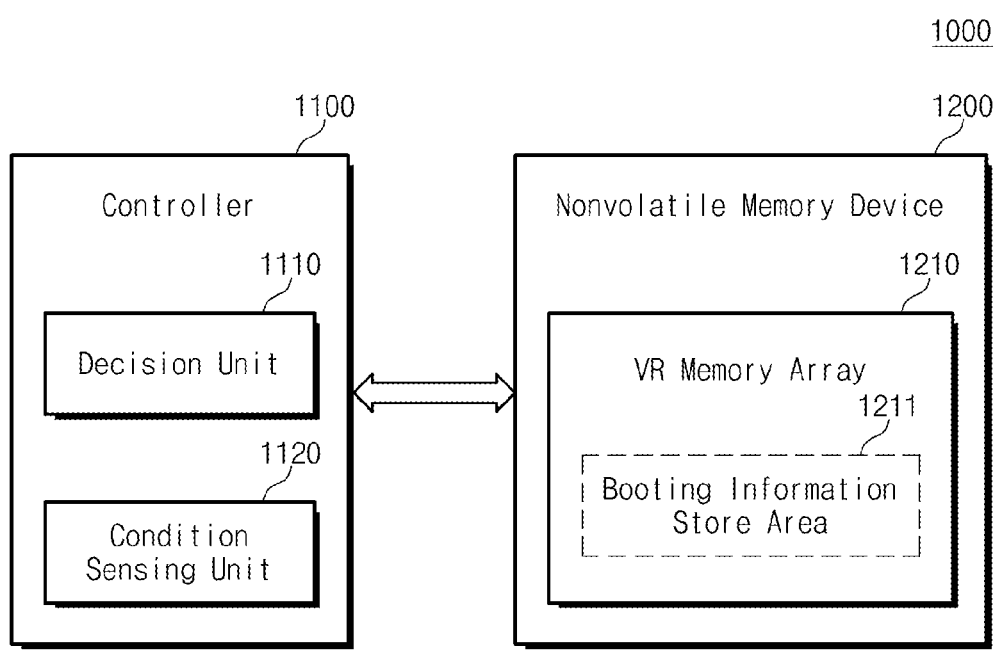
FIG. 1 is a block diagram schematically illustrating a memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment of the inventive concept.

A memory system 1000 according to an embodiment of the inventive concept may store booting information at a variable resistance memory when the booting information is set. When a system is rebooted, the memory system 1000 may perform a rebooting operation using the booting information which is stored at the variable resistance memory. An execution speed of a read operation of the variable resistance memory may be faster than that of a flash memory. Thus, the memory system 1000 may perform the rebooting operation relatively quickly.

Referring to FIG. 1, the memory system 1000 may include a controller 1100 and a nonvolatile memory device 1200.

The controller 1100 may be electrically connected to the nonvolatile memory device 1200, and may transmit and receive signals to and from the nonvolatile memory device 1200. For example, at a write operation, the controller 1100 may receive write data from a host and transfer the write data to the nonvolatile memory device 1200. At a read operation, the controller 1100 may receive data read from the nonvolatile memory device 1200 and send the read data to the host.

Whenever booting information is set, the controller 1100 may control the nonvolatile memory device 1200 such that the set booting information is stored at a variable resistance memory of the nonvolatile memory device 1200. Also, whenever a system is rebooted, the controller 1100 may determine whether to perform a rebooting operation using the booting information stored at the variable resistance memory.

The controller 1100 may compare a condition when booting information stored at the variable resistance memory is set with a condition at a system reboot, and based on the comparison may determine whether to use the booting information stored at the variable resistance memory to perform a rebooting operation. The controller 1100 may include a decision unit 1110 and a condition sensing unit 1120.

The condition sensing unit 1120 may sense a condition when booting information is set. For example, the condition sensing unit 1120 may sense conditions such as a temperature, a voltage, a time, and so on when the booting information is set. The condition sensing unit 1120 may provide the decision unit 1110 with the condition when the booting information is set. For ease of description, the condition when the booting information is set may be referred to as a booting setting condition.

The condition sensing unit 1120 may also sense a condition when a system is rebooted. Similar to the case where the booting information is set, for example, the condition sensing unit 1120 may sense conditions such as a temperature, a voltage, a time, and so on. The condition sensing unit 1120 may provide the decision unit 1110 with the condition when the system is rebooted. For ease of description, the condition when the system is rebooted may be referred to as a rebooting condition.

The decision unit 1110 may receive the booting setting condition and the rebooting condition from the condition sensing unit 1120. The decision unit 1110 may compare the booting setting condition and the rebooting condition to determine whether to perform a rebooting operation using the booting information stored at a variable resistance memory of the nonvolatile memory device 1200.

When there is needed a rebooting operation using the booting information stored at a variable resistance memory of the nonvolatile memory device 1200, the controller 1100 may receive the booting information stored at the variable resistance memory from the nonvolatile memory device 1200, and may perform a rebooting operation using the received booting information.

The nonvolatile memory device 1200 may include a variable resistance memory array 1210. The variable resistance memory array 1210 may include a plurality of memory cells. The plurality of memory cells may be implemented using the same type of memory elements or different types of memory elements.

For example, the plurality of memory cells may be formed of variable resistance memory cells. As another example, some of the plurality of memory cells may be formed of variable resistance elements, and the others may be formed of flash memory cells.

The variable resistance memory cell 1210 may include a booting information store area 1211. The booting information store area 1211 may be formed of variable resistance elements, and may be used to store booting information.

For example, in the event that booting information is set according to the control of the controller 1100, the booting information may be stored at the booting information store area 1211. As another example, if booting information is updated according to a control of the controller 1100, the updated booting information may be stored at the booting information store area 1211. In this case, previous booting information may be overwritten by the updated booting information.

The booting information store area 1211 may be used to store the booting setting condition. For example, in the event that booting information is set according to a control of the controller 1100, the booting setting condition such as a temperature, a time, a voltage, and so on when the booting information is set may be stored at the booting information store area 1211.

When the memory system 1000 is rebooted, the booting setting condition stored at the booting information store area 1211 may be provided to the decision unit 1110 of the controller 1100. Also, a rebooting condition sensed by the condition sensing unit 1120 may be provided to the decision unit 1110. If the booting setting condition and the rebooting condition are both contained within a predetermined range, the decision unit 1110 may control the nonvolatile memory device 1200 and the controller 1100 to perform a rebooting operation using the booting information stored at the booting information store area 1211. Accordingly, the memory system 1000 may perform a rebooting operation relatively quickly.

Figure 2:
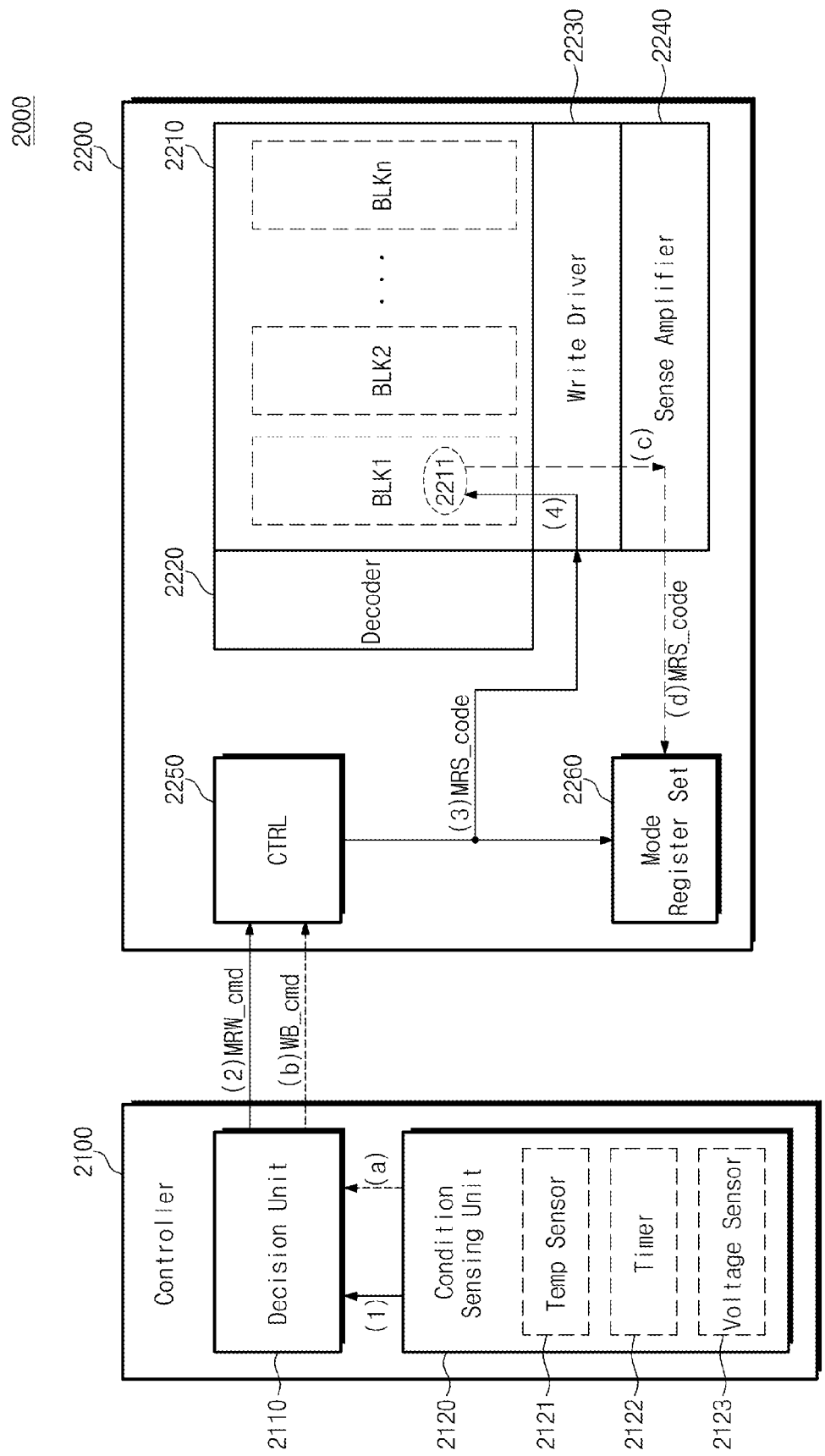
FIG. 2 is a block diagram illustrating an embodiment of a memory system shown in FIG. 1.

FIG. 2 is a block diagram illustrating an embodiment of a memory system shown in FIG. 1. In FIG. 2, there is described an example in which Mode Register Set (MRS) information of booting information is stored at a variable resistance memory and a rebooting operation is performed using the stored MRS information. Referring to FIG. 2, a memory system 2000 may include a controller 2100 and a nonvolatile memory device 2200.

The controller 2100 may transmit and receive signals and data to and from the nonvolatile memory device 2200. In the event that the MRS information is set, the controller 2100 may control the nonvolatile memory device 2200 such that the MRS information is stored at a variable resistance memory of the nonvolatile memory device 2200. In the event that a rebooting operation is performed, the controller 2200 may control the nonvolatile memory device 2200 to perform a rebooting operation using the MRS information stored at the variable resistance memory. The controller 2100 may include a decision unit 2110 and a condition sensing unit 2120.

The condition sensing unit 2120 may include a temperature sensor 2121, a timer 2122, and a voltage sensor 2123, and may sense a condition such as a temperature, a time, and a voltage when the MRS information is set. For example, the temperature sensor 2121 of the condition sensing unit 2120 may sense an external temperature when booting information is set or a temperature of the memory system 2000. The timer 2122 may check a time when the booting information is set, and the voltage sensor 2123 may sense a level of a voltage provided from an external device when the booting information is set. For ease of description, temperature, time, and voltage conditions when MRS information is set may be referred to as an MRS setting condition.

Also, the condition sensing unit 2120 may sense temperature, time, and voltage conditions at a system reboot. For example, the temperature sensor 2121, the timer 2122, and the voltage sensor 2123 may sense an external temperature (or, a temperature of the memory system 2000), a time, and an external voltage level, respectively. As before, for ease of description, conditions sensed by the condition sensing unit 2120 at rebooting may be referred to as a rebooting condition.

Whenever MRS information is set, the decision unit 2110 may send an MRS write command MRW_cmd to the nonvolatile memory device 2200 such that the MSR information is stored at a booting information store area 2211 of a memory cell array 2210.

Whenever MRS information is set, the decision unit 2110 may receive an MRS setting condition from the condition sensing unit 2120 to control the nonvolatile memory device 2200 such that the MRS setting condition is stored at the booting information store area 2211 of the memory cell array 2210.

At rebooting, the decision unit 2110 may receive the MRS setting condition from the nonvolatile memory device 2200, and the rebooting condition from the condition sensing unit 2120. The decision unit 2110 may compare the MRS setting condition and the rebooting condition to decide whether to use MRS information stored at the booting information store area 2211 of the memory cell array 2210 to perform the rebooting operation.

For example, in the event that the MRS setting condition and the rebooting condition are both contained within a predetermined error range, the decision unit 2110 may control the nonvolatile memory device 2200 to perform a rebooting operation using MRS information stored at the booting information store area 2211. For ease of description, a rebooting operation executed using the MRS information stored at the booting information store area 2211 may be referred to as a warm boot.

As another example, in the event that the MRS setting condition and the rebooting condition are not both contained within the predetermined error range, the decision unit 2110 may control the nonvolatile memory device 2200 to newly set MRS information. For example, a rebooting operation executed by newly setting MRS information may be referred to as a cold boot.

As described above, the cold boot is performed in the case where the rebooting condition and the booting setting condition are not within a predetermined error range, i.e., are not sufficiently close to each other in value. This is because the booting information stored at the variable resistance memory may become unreliable if the conditions at reboot differ to greatly from the conditions at which the booting information was stored. The inventive concept is not limited by the condition or conditions being monitored. In the example given above, the condition monitored is one or more of temperature, a supply voltage, and time (i.e., an elapsed time between the reboot and the previous storage of the booting information). The inventive concept is also not limited by specific values of the predetermined error range. For example, an acceptable range in temperature may be readily determined by the chip designer based on a variety of factors, including operating environment. Likewise, an acceptable variation in supply voltage and/or an acceptable lapse of time are variables that may be readily determined by the designer.

The memory system 2000 according to an embodiment of the inventive concept may perform a rebooting operation relatively quickly by executing a warm boot when the MRS setting condition and the rebooting condition are both contained within the predetermined error range. MRS information may be stored at a variable resistance memory, and a read operation on the variable resistance memory may be faster than that of other types of nonvolatile memory. Thus, the memory system 2000 may perform the rebooting operation relatively quickly.

Continuing to referring to FIG. 2, the nonvolatile memory device 2200 may include a memory cell array 2210, a decoder 2220, a write driver 2230, a sense amplifier 2240, control logic 2250, and a mode register set 2260.

The memory cell array 2210 may include a plurality of blocks BLK1 to BLKn, each of which includes a plurality of memory cells each storing data. The memory cell array 2210 may include the booting information store area 2211, which is used to store MRS information and an MRS setting condition.

In example embodiments, the memory cell array 2210 may be formed of variable resistance elements. To support a rapid booting speed, memory cells of the booting information store information of the memory cell array 2210 may be implemented by variable resistance elements. For example, the memory cells of the memory cell array 2210 may be implemented by spin transfer torque magneto resistive random access memory (STT-MRAM) cells.

In the event that the memory cells are formed of STT-MRAM cells, they may include magnetic tunnel junction elements (hereinafter, referred to as variable resistance elements) each having magnetic material, respectively. Examples of the memory cells in the memory cell array 2210 will be more fully later described with reference to FIGS. 5 to 15.

The decoder 2220 may be connected to the memory cell array 2210, and may select a word line or a bit line. For example, if MRS information is stored at the booting information store area 2211 of the memory cell array 2210, the decoder 2220 may select a word line and a bit line connected with memory cells at which the MRS information is to be stored.

At a write operation, the write driver 2230 may provide a write current corresponding to write requested data to the memory cell array via a bit line. At a read operation, the write driver 2230 may supply a read current to the memory cell array 2210 via a bit line.

At a read operation, the sense amplifier 2240 may receive a data voltage via a bit line to amplify the received data voltage. The sense amplifier 2240 may be configured to include a plurality of sense amplifier circuits to sense and amplify data voltages. For example, each sense amplifier circuit may compare a data voltage with a reference voltage to output a comparison result as a digital data signal.

The control logic 2250 may control the nonvolatile memory device 2200 in response to a request of the decision unit 2110 of the controller 2100 to store MRS information at the booting information store area 2211 of the memory cell array 2210.

For example, the control logic 2250 may decode an MRS write command MRW_cmd provided from the decision unit 2110 to generate an MRS code MRS_code. The control logic 2250 may control the nonvolatile memory device 2200 such that the MRS code MRS_code is stored at the mode register set 2260 and the booting information store area 2211, respectively. In this case, the control logic 2250 may store an MRS setting condition provided from the controller 2100 at the booting information store area 2211 together with the MRS code MRS_code.

The control logic 2250 may control the nonvolatile memory device 2200 in response to a request of the decision unit 2110 of the controller 2100 to perform a rebooting operation using MRS information stored at the booting information store area 2211.

For example, the control logic 2250 may perform the warm boot operation in response to a warm boot command WB_cmd from the decision unit 2110. In this case, the MRS code MRS_code stored at the booting information store area 2211 may be read out, and the read MRS code MRS_code may be stored at the mode register set 2260. The mode register set 2260 may store the MRS code MRS_code input at booting.

As described above, the memory system according to an embodiment of the inventive concept may relatively quickly perform a rebooting operation via the warm boot operation. Below, an operating method of the memory system 2000 to support the warm boot operation will be more fully described.

Figure 3:
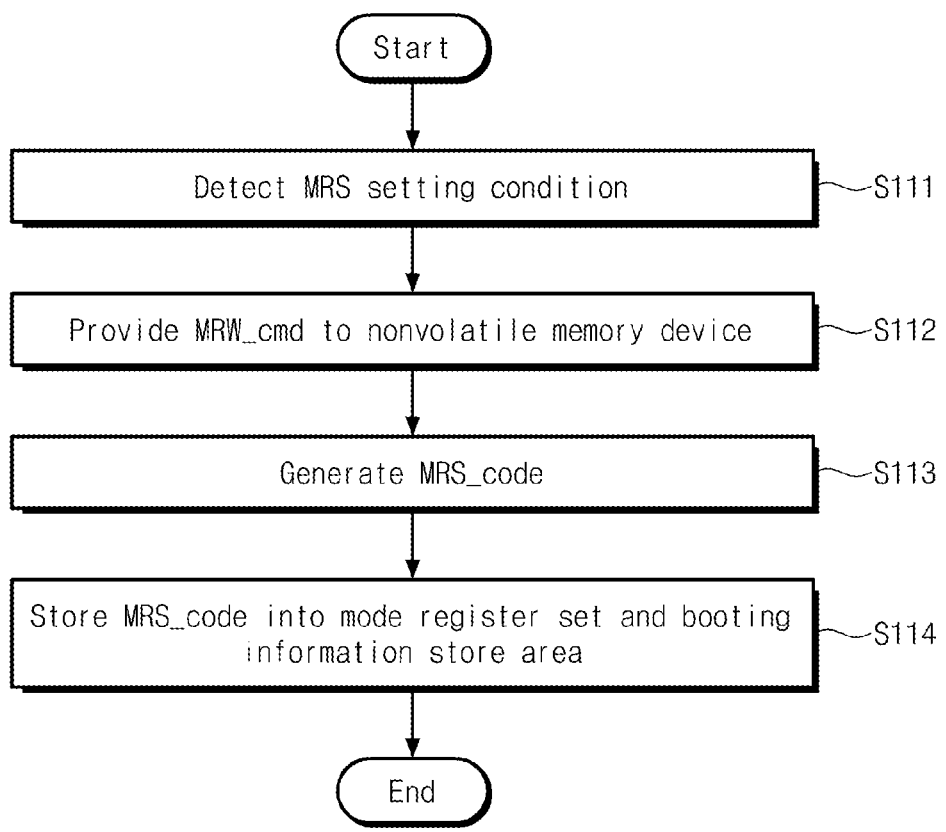
FIGS. 3 and 4 are flow charts illustrating an operation of a memory system shown FIG. 2.
Figure 4:
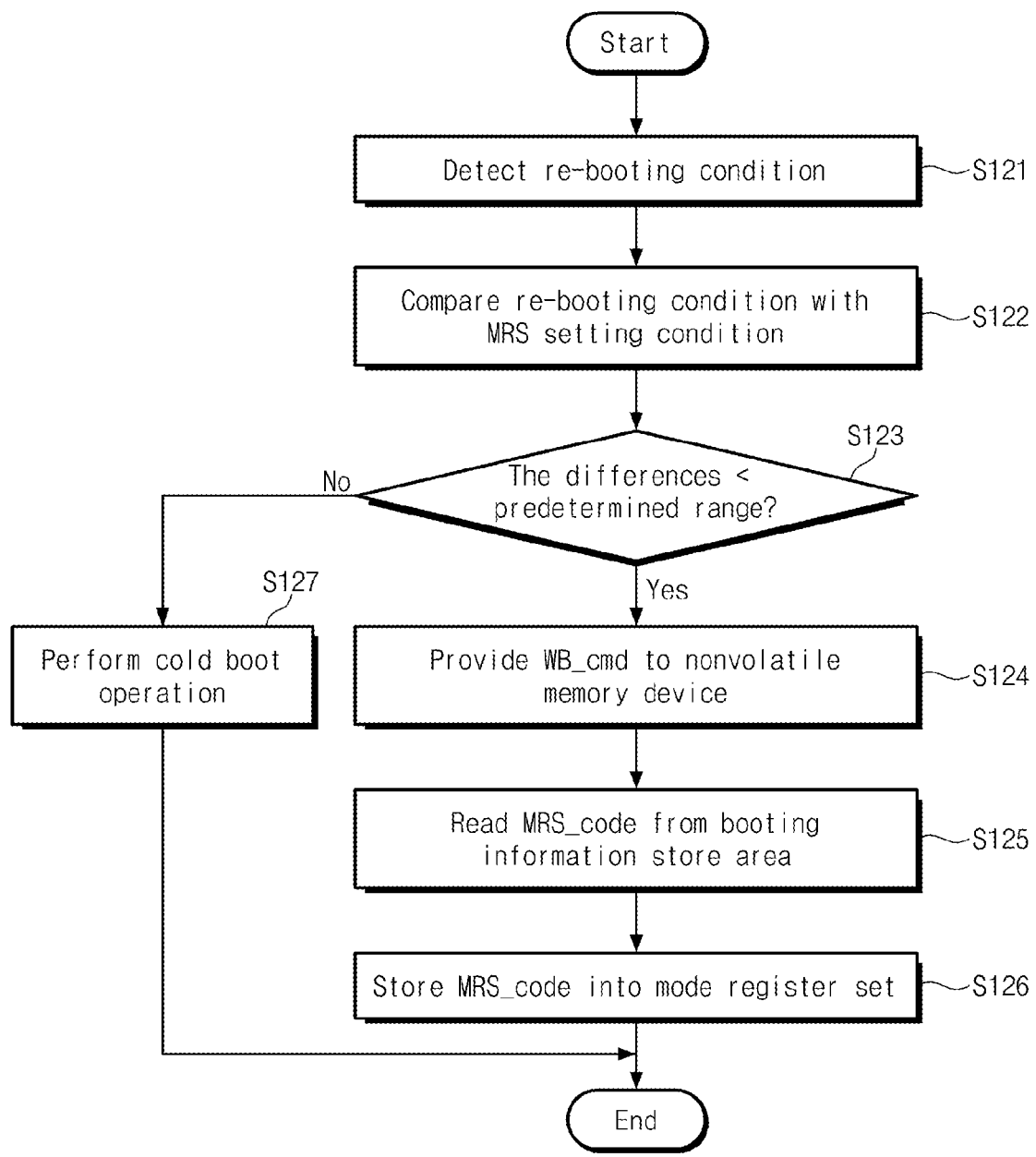

FIGS. 3 and 4 are flow charts illustrating an operation of a memory system shown in FIG. 2. First, an operating method of a memory system 2000 in which MRS information is stored in a variable resistance memory will be described. Thereafter, an operating method of the memory system 2000 to perform a warm boot operation using MRS information stored at the variable resistance memory will be described.

The operating methods of the memory system 2000 in FIGS. 3 and 4 will be described with reference to FIG. 2. The solid-lined arrows depicted in FIG. 2 relate to an embodiment in which MRS information is stored at a variable resistance memory. The dashed-lined arrows depicted in FIG. 2 relate to a warm boot operation performed using the MRS information stored at the variable resistance memory.

Referring to FIG. 3, in operation S111, an MRS setting condition may be detected. For example, the condition sensing unit 2120 may sense an MRS setting condition such as a temperature, a time, a voltage, and so on to provide information on the MRS setting condition to the decision unit 2110 (refer to (1) in FIG. 2).

In operation S112, an MRS write command MRW_cmd may be provided to a nonvolatile memory device 2200. For example, a decision unit 2110 may provide the MRW_cmd to control logic 2250 (Referring to (2) in FIG. 2). In this case, the decision unit 2110 may provide information on an MRS setting condition to the control logic 2250 together with the MRW_cmd.

In operation S113, an MRS code MRS_code may be generated. In operation S114, the MRS code MRS_code may be stored at a mode register set 2260 and a booting information store area 2211. For example, the control logic 2250 may decode the MRS write command MRW_cmd to generate the MRS code MRS_code, and may store the MRS code MRS_code at the mode register set 2260 and the booting information store area 2211, respectively (refer to (3) and (4) in FIG. 2). In this case, the control logic 2250 may store information on an MRS setting condition at the booting information store area 2211 together with the MRS code MRS_code.

Referring to FIG. 4, in operation S121, a rebooting condition may be detected. For example, the condition sensing unit 2120 may sense a rebooting condition such as a temperature, a time, a voltage, and so on to provide information on the rebooting condition to the decision unit 2110 (refer to (a) in FIG. 2).

In operation S122, the rebooting condition may be compared with the MRS setting condition. In operation S123, whether the rebooting condition and the MRS setting condition are both contained within a predetermined error range may be determined. For example, the decision unit 2110 may compare the rebooting condition with the MRS setting condition to determine whether the rebooting condition and the MRS setting condition are within the predetermined error range. In this case, the decision unit 2110 may receive information associated with the MRS setting condition from the booting information store area 2211.

In the event that the rebooting condition and the MRS setting condition are within the predetermined error range, in operation S124, a warm boot command WB_cmd may be provided to the nonvolatile memory device 2200. For example, in the event that the rebooting condition and the MRS setting condition are within the predetermined error range, the decision unit 2110 may provide the warm boot command WM_cmd to the control logic 2250 (refer to (b) in FIG. 2). In this case, the control logic 2250 may control the nonvolatile memory device 2200 in response to warm boot command WM_cmd such that the following warm boot operation is performed.

In operation S125, there may be performed a read operation on the MRS code MRS_code stored at the booting information store area 2211. That is, a sense amplifier 2240 may read the MRS code MRS_code stored at the booting information store area 2211 (refer to (c) in FIG. 2).

In operation S126, the read MRS code MRS_code may be stored at the mode register set 2260. That is, the MRS code MRS_code read by the sense amplifier 2240 may be sent to the mode register set 2260, and the mode register set 2260 may store the MRS code MRS_code (refer to (d) in FIG. 2).

As a result, a memory system 2000 according to an embodiment of the inventive concept may skip an MRS information setting operation by executing the warm boot operation. Thus, the memory system 2000 may perform a rebooting operation relatively quickly.

In the event that the rebooting operation and the MRS setting condition are not both contained within the predetermined error range, in operation S127, a cold booting operation may be performed. In this case, the cold booting operation may be performed in a similar manner as operations S112 to S114 described in FIG. 3. In this case, the rebooting condition may replace an MRS setting condition sensed at a previous booting operation. For example, the rebooting condition may be overwritten at an MRS setting condition stored at the booting information store area 2211. Also, an MRS code set at execution of a previous booting operation may be replaced with an MRS code newly set at execution of a rebooting operation. For example, the newly set MRS code may be overwritten at a previously set MRS code stored at the booting information store area 2211.

Figure 5:
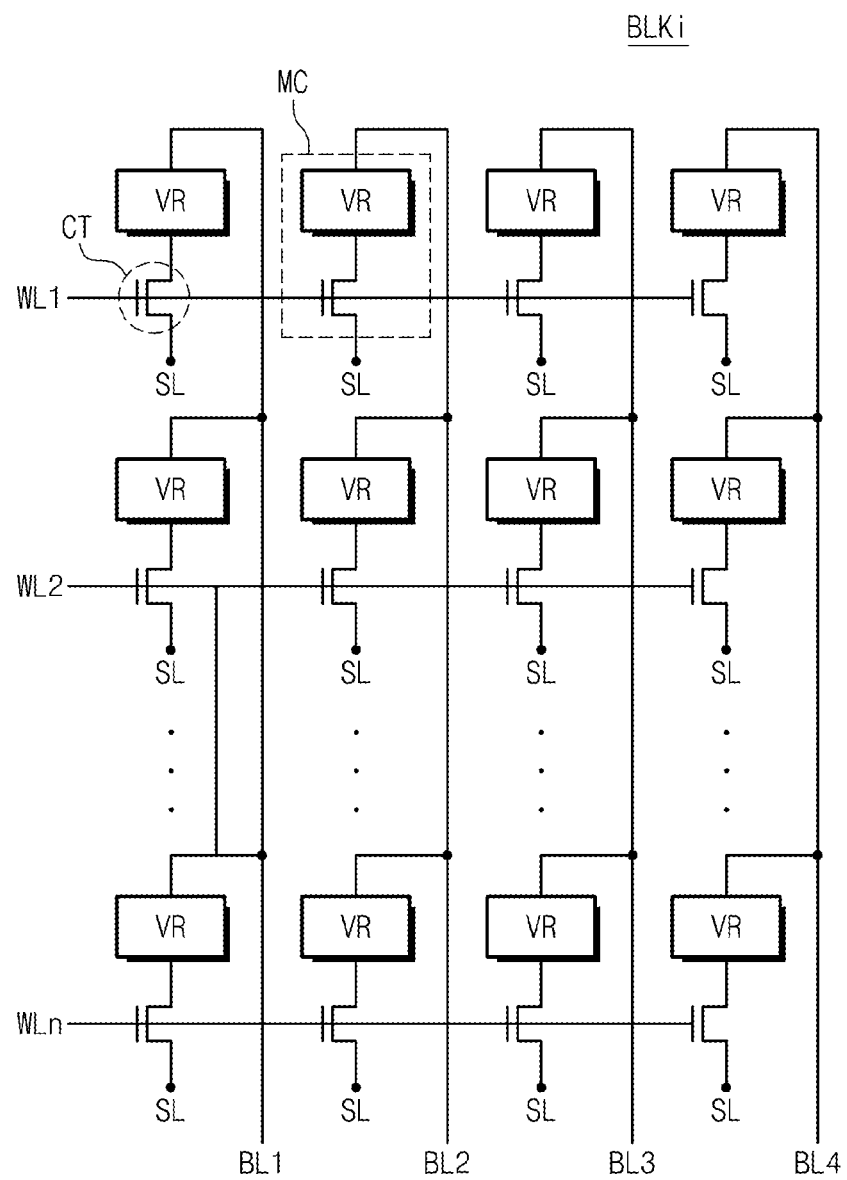
FIG. 5 is a diagram illustrating a structure of a memory cell array shown in FIG. 2.

FIG. 5 is a diagram illustrating a structure of a memory cell array shown in FIG. 2. In FIG. 5, there is illustrated a block of a memory cell array 2210 shown in FIG. 2. For ease of description, it is assumed that a block BLKi in FIG. 5 is connected with four bit lines BL1 to BL4.

Referring to FIG. 5, the block BLKi may include a plurality of memory cells MC. Each memory cell MC may include a variable resistance memory VR and a cell transistor CT. Even though a current (or, a voltage) is blocked, the variable resistor element VR may maintain a resistance value. That is, the variable resistor element VR may have a nonvolatile characteristic.

The variable resistor element VR may be implemented by a variety of elements. For example, the variable resistor element VR may be implemented by an STT-MRAM element. As another example, the variable resistor element VR may be implemented by a phase change random access memory (PRAM) using a phase change material, a resistive random access memory (RRAM) using a variable resistance material of a complex metal oxide, or a magnetic random access memory (MRAM) using a ferromagnetic material.

A gate of the cell transistor CT may be connected with a word line. The cell transistor CT may be switched on or off by a signal provided through the word line. A drain of the cell transistor CT may be connected to the variable resistance element VR and a source thereof may be connected to a source line SL.

For example, all sources of the cell transistors CT of the memory cells MC may be connected with the same source line. As another example, sources of the cell transistors CT of the memory cells MC may be connected with different source lines.

Figure 6:
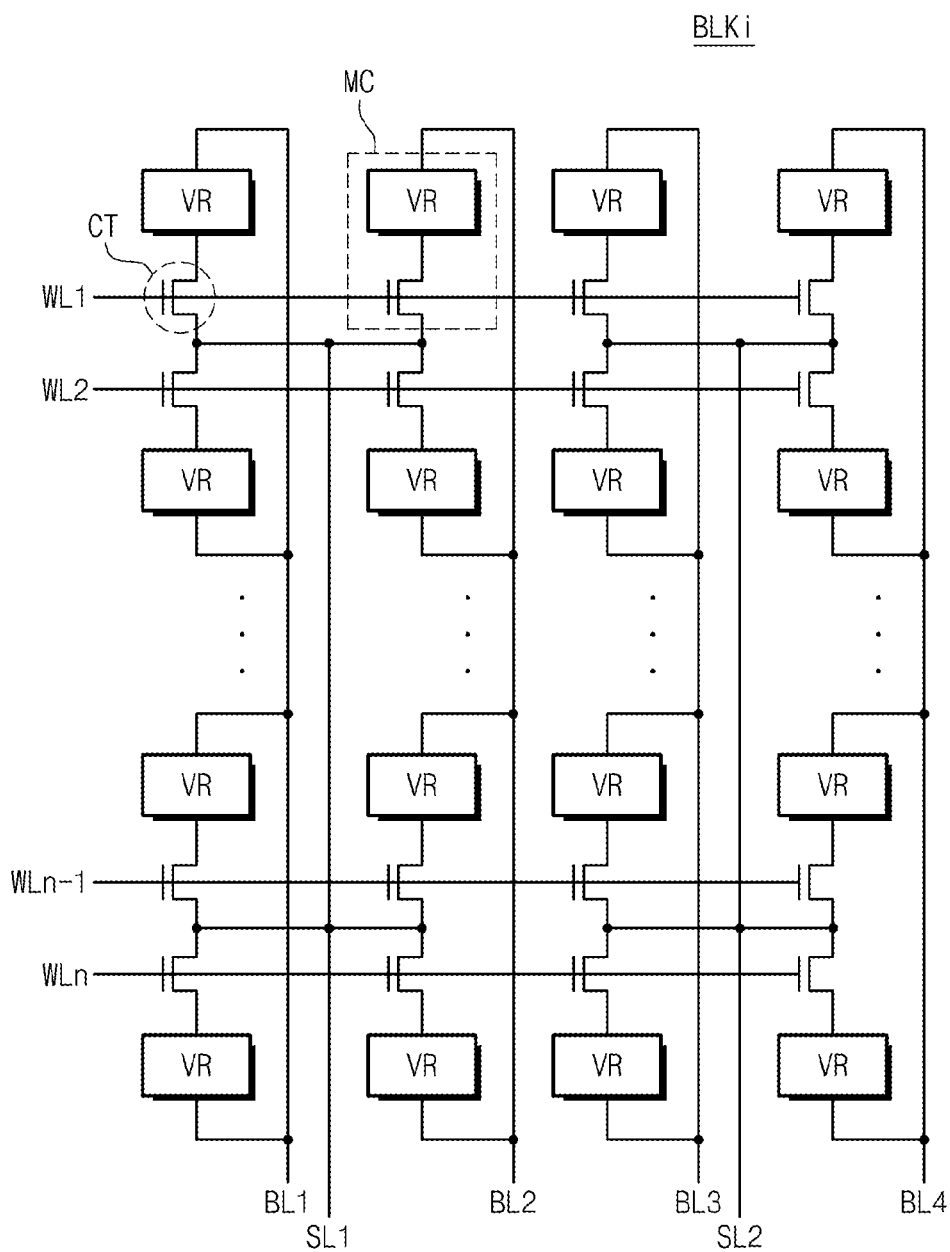
FIG. 6 is a diagram illustrating a structure of a memory cell array shown in FIG. 2 according to another embodiment of the inventive concept.

FIG. 6 is a diagram illustrating a structure of a memory cell array shown in FIG. 2 according to another embodiment of the inventive concept.

As illustrated in FIG. 6, a block BLKi of a memory cell array 2210 may be configured such that four different memory cells MC share a source line SL. Otherwise, a remaining structure of the block BLKi in FIG. 6 may be similar to that shown in FIG. 5, and a further description thereof is thus omitted.

Figure 7:
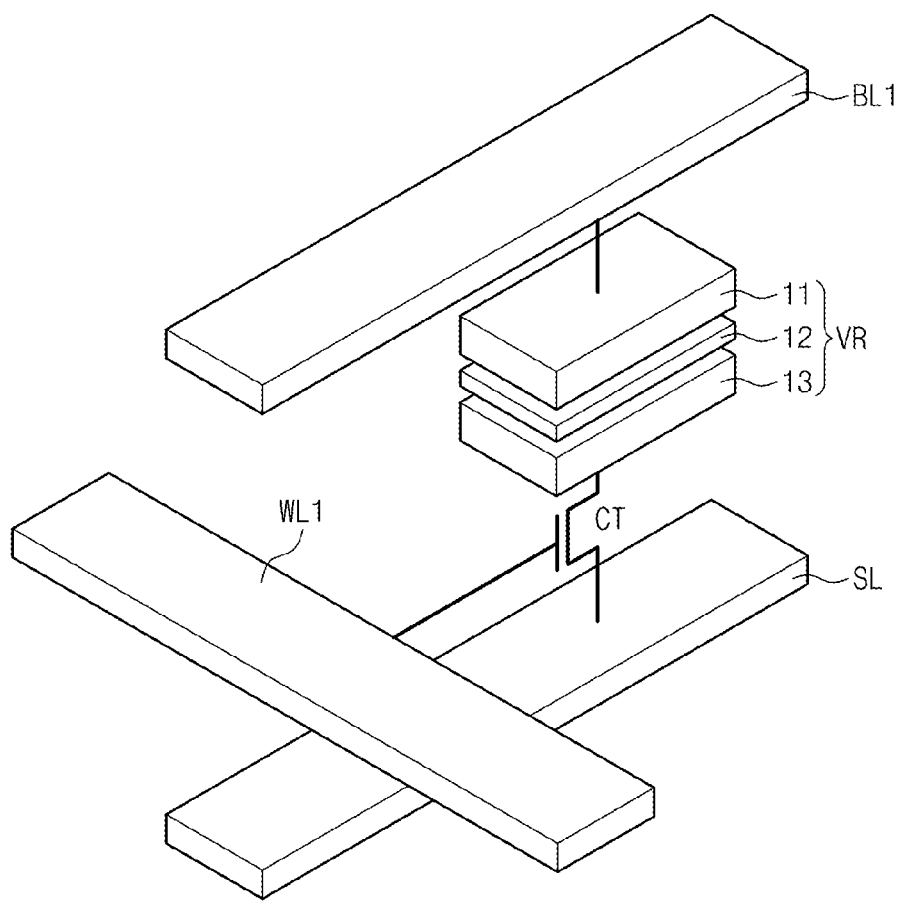
FIG. 7 is a diagram illustrating a memory cell according to an embodiment of the inventive concept.

FIG. 7 is a diagram illustrating a memory cell according to an embodiment of the inventive concept. In FIG. 7, there is illustrated an example in which a memory cell MC is implemented by an STT-MRAM cell.

The memory cell MC may include a variable resistance element VR and a cell transistor CT. A gate of the cell transistor CT may be connected with a word line (e.g., a first word line WL1). One electrode of the cell transistor CT may be connected with a bit line (e.g., a first bit line BL1) via the variable resistance element VR, and the other electrode thereof may be connected with a source line (e.g., a first source line SL1).

The variable resistance element VR may include a pinned layer 13, a free layer 11, and a tunnel layer 12 interposed between the pinned layer 13 and the free layer 11. A magnetization direction of the pinned layer 13 may be fixed, and a magnetization direction of the free layer 11 may be identical to or opposite to that of the pinned layer 13 according to a condition. An anti-ferromagnetic layer (not shown) may be further provided to fix a magnetization direction of the pinned layer 13, for example.

Data stored at the variable resistance element VR may be determined according to a resistance value measured under a bias condition in which a logic-high voltage is applied to the word line WL1 to turn on the cell transistor CT and a read current is provided in a direction from the bit line BL1 to a source line.

To execute a write operation of the STT-MRAM, a logic-high voltage may be applied to the word line WL1 to turn on the cell transistor CT, and a write current is provided between the bit line BL1 and the source line.

Figure 8:
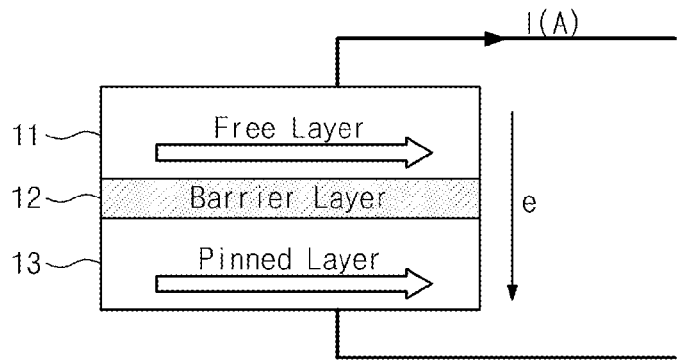
FIGS. 8 and 9 are diagrams illustrating a magnetization direction of a variable resistance element which defines the data stored therein.
Figure 9:
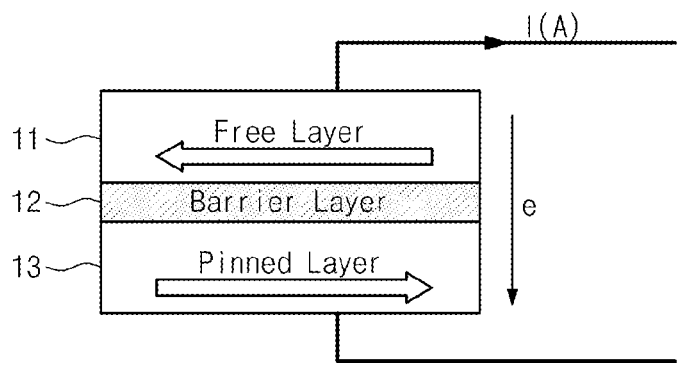

FIGS. 8 and 9 are diagrams illustrating different magnetization directions of a variable resistance element so as to define the data stored therein.

A resistance value of a variable resistance element VR may vary according to a magnetization direction of a free layer 11. If a read current I is provided to the variable resistance element VR, a data voltage corresponding to a resistance value of the variable resistance element VR may be output. Since an intensity of the read current I is less than that of a write current, a magnetization direction of the free layer 11 may not vary by the read current I.

Referring to FIG. 8, a magnetization direction of the free layer 11 may be parallel with a magnetization direction of a pinned layer 13. In this case, the variable resistance element VR may have a small resistance value indicative of data '0'.

Referring to FIG. 9, a magnetization direction of the free layer 11 may be anti-parallel with a magnetization direction of the pinned layer 13. In this case, the variable resistance element VR may have a large resistance value indicative of data '1'.

In FIGS. 8 and 9, the free layer 11 and the pinned layer 13 of an MTJ cell 10 are illustrated to be a horizontal magnetic element. However, the inventive concept is not limited thereto. As another example, the free layer 11 and the pinned layer 13 may be implemented using a vertical magnetic element.

Figure 10:
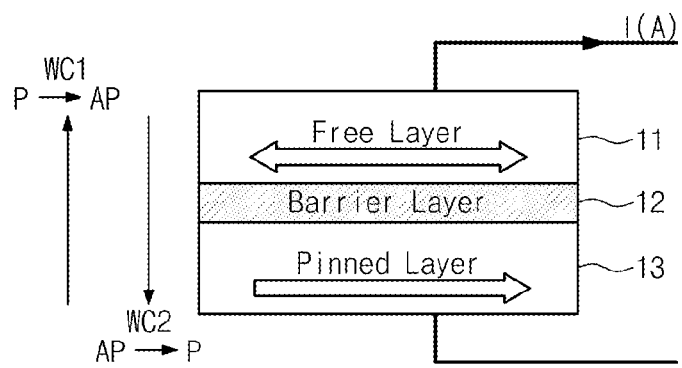
FIG. 10 is a diagram illustrating a write operation of an STT-MRAM.

FIG. 10 is a diagram for use in describing a write operation of an STT-MRAM.

Referring to FIG. 10, a magnetization direction of a free layer 11 may be decided according to directions of write currents WC1 and WC2. For example, if the first write current WC1 is provided, free electrons having the same spin direction as a pinned layer 13 may apply a torque to the free layer 11. In this case, the free layer 11 may be magnetized to be parallel with the pinned layer 13.

If the second write current WC2 is provided, free electrons having a spin direction opposite to that of the pinned layer 13 may apply a torque to the free layer 11. In this case, the free layer 11 may be magnetized to be anti-parallel with the pinned layer 13. That is, a magnetization direction of the free layer 11 may be changed by a spin transfer torque (STT).

Figure 11:
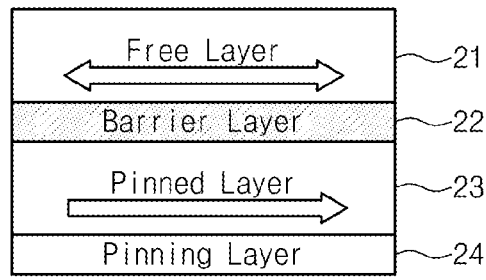
FIGS. 11 and 12 are diagrams illustrating a variable resistance element of an STT-MRAM according to embodiments of the inventive concept.
Figure 12:
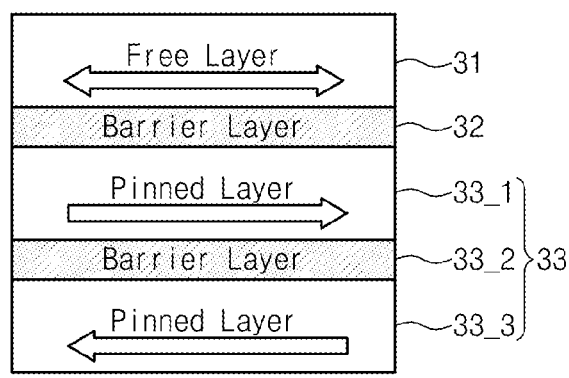

FIGS. 11 and 12 are diagrams illustrating a variable resistance element of an STT-MRAM according to embodiments of the inventive concept. In a variable resistance element in which magnetization directions are parallel with each other, a current direction may be substantially vertical to an easy axis.

Referring to FIG. 11, a variable resistance element VR may include a free layer 21, a tunnel layer 22, a pinned layer 23, and an anti-ferromagnetic layer 24.

The free layer 21 may include a material having a variable magnetization direction. A magnetization direction of the free layer 21 may be changed by an electric/magnetic factor provided from an interior and/or exterior of a memory cell.

The free layer 21 may include a ferromagnetic material including at least one of Co, Fe, or Ni. For example, the free layer 24 may include at least one selected from a group of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

The tunneling layer 22 may have a thickness that is thinner than a spin diffusion distance. The tunnel layer 22 may include a non-magnetic material. As an example, the tunnel layer 22 may include at least one selected from a group of Mg, Ti, Al, a compound of MgZn and MgB, and a nitride of Ti and V.

The pinned layer 23 may have a magnetization direction fixed by the anti-ferromagnetic layer 24. The pinned layer 23 may include a ferromagnetic material. For example, the pinned layer 23 may include at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

The anti-ferromagnetic layer 24 may include an anti-ferromagnetic material. For example, the anti-ferromagnetic layer 24 may include at least one selected from a group of PtMn, IrMn, MnO, MnS, MnTe, MnF2, FeCl2, FeO, CoCl2, CoO, NiCl2, NiO, and Cr.

Referring to FIG. 12, a pinned layer 33 may be formed of a synthetic anti-ferromagnetic (SAF) material. The pinned layer 33 may include a first ferromagnetic layer 33_1, a coupling layer 33_2, and a second ferromagnetic layer 33_3. Each of the first and second ferromagnetic layers may include at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

At this time, a magnetization direction of the first ferromagnetic layer 33_1 and a magnetization direction of the second ferromagnetic layer 33_3 may be different and fixed. The coupling layer 33_2 may include Ru.

Figure 13:
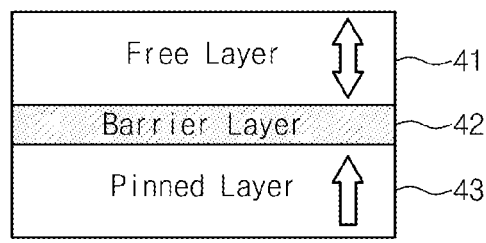
FIG. 13 is a diagram illustrating a variable resistance element of an STT-MRAM according to still another embodiment of the inventive concept.

FIG. 13 is a diagram illustrating a variable resistance element of an STT-MRAM according to still another embodiment of the inventive concept. In a variable resistance element in which magnetization directions are vertical to each other, a current direction and an easy axis may be substantially parallel with each other. Referring to FIG. 13, a variable resistance element VR may include a free layer 41, a pinned layer 43, and a tunnel layer 42.

A resistance value may become small when a magnetization direction of the free layer 41 and a magnetization direction of the pinned layer 43 are parallel, and may become large when a magnetization direction of the free layer 41 and a magnetization direction of the pinned layer 43 are anti-parallel. Data may be stored according to a resistance value.

To implement a variable resistance element VR in which magnetization directions are vertical, it is desirable to form the free and pinned layers 41 and 43 using a material having a large magnetic anisotropy energy. The material with the large magnetic anisotropy energy may include an amorphous rare-earth element alloy, a multi-layer thin film such as (Co/Pt)n or (Fe/Pt)n, and a material having an L10 crystal structure.

For example, the free layer 41 may be an ordered alloy, and may include at least one of Fe, Co, Ni, Pa, or Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, or Co—Ni—Pt alloy. The alloys may be Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy, and may include at least one of Fe, Co, Ni, Pa, or Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, or Co—Ni—Pt alloy. The alloys may be Fe50Pt50, Fe50Pd50, Co50Pd50, Co50Pt50, Fe30Ni20Pt50, Co30Fe20Pt50, or Co30Ni20Pt50.

Figure 14:
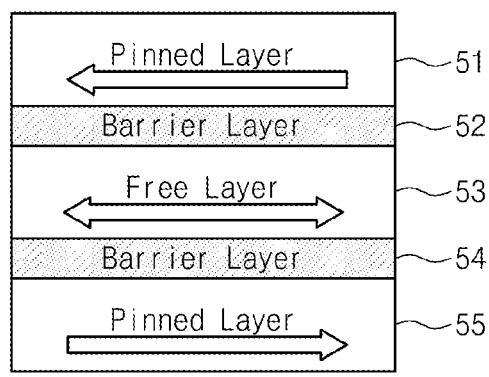
FIGS. 14 and 15 are diagrams illustrating variable resistance elements of an STT-MRAM according to still other embodiments of the inventive concept.
Figure 15:
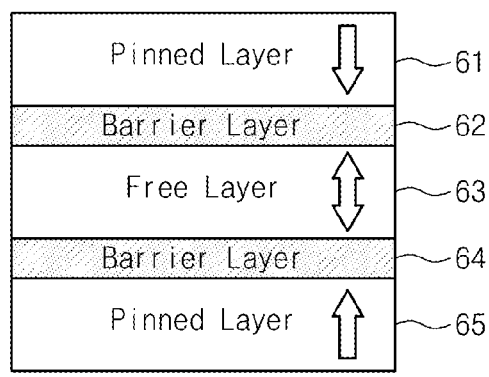

FIGS. 14 and 15 are diagrams illustrating variable resistance elements of an STT-MRAM according to still other embodiments of the inventive concept. A dual variable resistance element may have a structure in which a tunnel layer and a pinned layer are disposed at both ends on the basis of a free layer.

Referring to FIG. 14, the dual variable resistance element forming a horizontal magnetism may include a first pinned layer 51, a first tunnel layer 52, a free layer 53, a second tunnel layer 54, and a second pinned layer 55. Materials forming the respective layers may be equal or similar to those of layers 21, 22, and 23 in FIG. 11.

If a magnetization direction of the first pinned layer 51 and a magnetization direction of the second pinned layer 55 are fixed in an opposite direction, magnetic forces of the first and second pinned layers 51 and 55 may be offset. Thus, the dual variable resistance element may be written using a current which is less in amount than other variable resistance elements.

Since the dual variable resistance element provides a larger resistance value by the second tunnel layer 54 at a read operation, it is possible to accurately obtain a data value.

Referring to FIG. 15, a dual variable resistance element forming vertical magnetism may include a first pinned layer 61, a first tunnel layer 62, a free layer 63, a second tunnel layer 64, and a second pinned layer 65. Materials forming the respective layers may be equal or similar to those of layers 41, 42, and 43 shown in FIG. 13.

If a magnetization direction of the first pinned layer 61 and a magnetization direction of the second pinned layer 65 are fixed in an opposite direction, magnetic forces of the first and second pinned layers 61 and 65 may be offset. Thus, the dual variable resistance element 60 may be written using a current that is less in amount than other variable resistance elements.

As described with reference to FIGS. 5 to 15, a memory system 2000 according to an embodiment of the inventive concept may use a variable resistance element VR as a storage element. A read speed of the variable resistance element may be faster than that of other types of nonvolatile memory such as a flash memory. Thus, as described with reference to FIG. 2, in the event that a warm boot operation is performed, MRS information stored at a booting information store area 2211 may be loaded onto a mode register set 2260 quickly.

Further, since an MRS information setting operation is skipped at the warm boot operation, the memory system 2000 may perform a rebooting operation more quickly.

Figure 16:
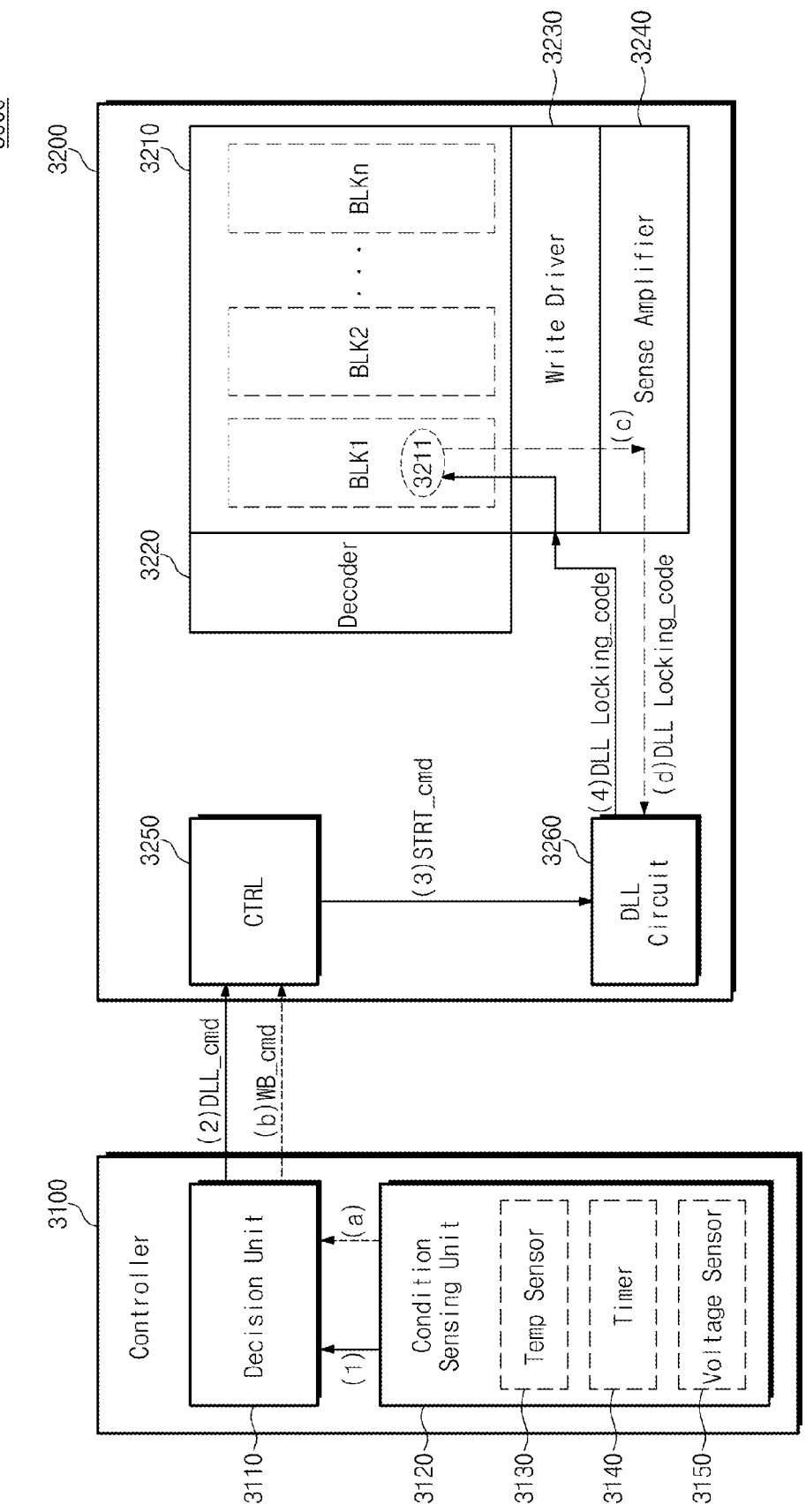
FIG. 16 is a block diagram schematically illustrating a memory system according to another embodiment of the inventive concept.

FIG. 16 is a block diagram schematically illustrating a memory system according to another embodiment of the inventive concept. An embodiment in which delay locked loop (DLL) information of booting information is stored at a variable resistance memory and a rebooting operation is executed using the DLL information will be described with reference to FIG. 16.

A memory system 3000 shown in FIG. 16 may be similar to that shown in FIG. 2, and the description below is primarily limited to the differences between the memory system 3000 shown in FIG. 16 and the memory system 2000 in shown FIG. 2. To avoid redundancy, a description is omitted below of the same or similar components and operations of the memory systems 2000 and 3000.

Referring to FIG. 16, the memory system 3000 may include a controller 3100 and a nonvolatile memory device 3200. The controller 3100 may include a decision unit 3110 and a condition sensing unit 3120. The nonvolatile memory device 3200 may include a memory cell array 3210, a decoder 3220, a write driver 3230, a sense amplifier 3240, control logic 3250, and a DLL circuit 3260.

Unlike the memory system 2000 shown in FIG. 2, the memory system 3000 may be configured such that DLL information is stored at a booting information store area 3211 of the memory cell array 3210. In the event that a warm boot operation is performed, the memory system 3000 may read DLL information from a booting information store area 3211 of the memory cell array 3210 to send it to the DLL circuit 3260. Thus, at booting, the memory system 3000 may skip a DLL locking operation to perform a rebooting operation relatively quickly.

Figure 17:
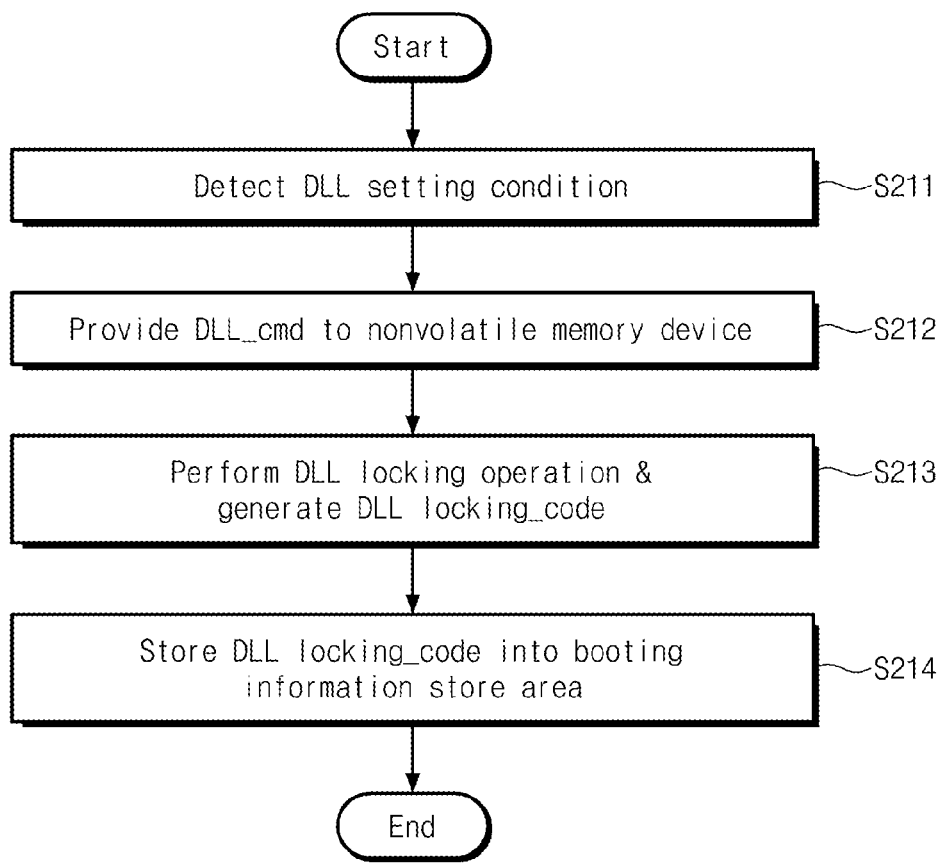
FIGS. 17 and 18 are flow charts illustrating an operating method of a memory system shown in FIG. 16.
Figure 18:
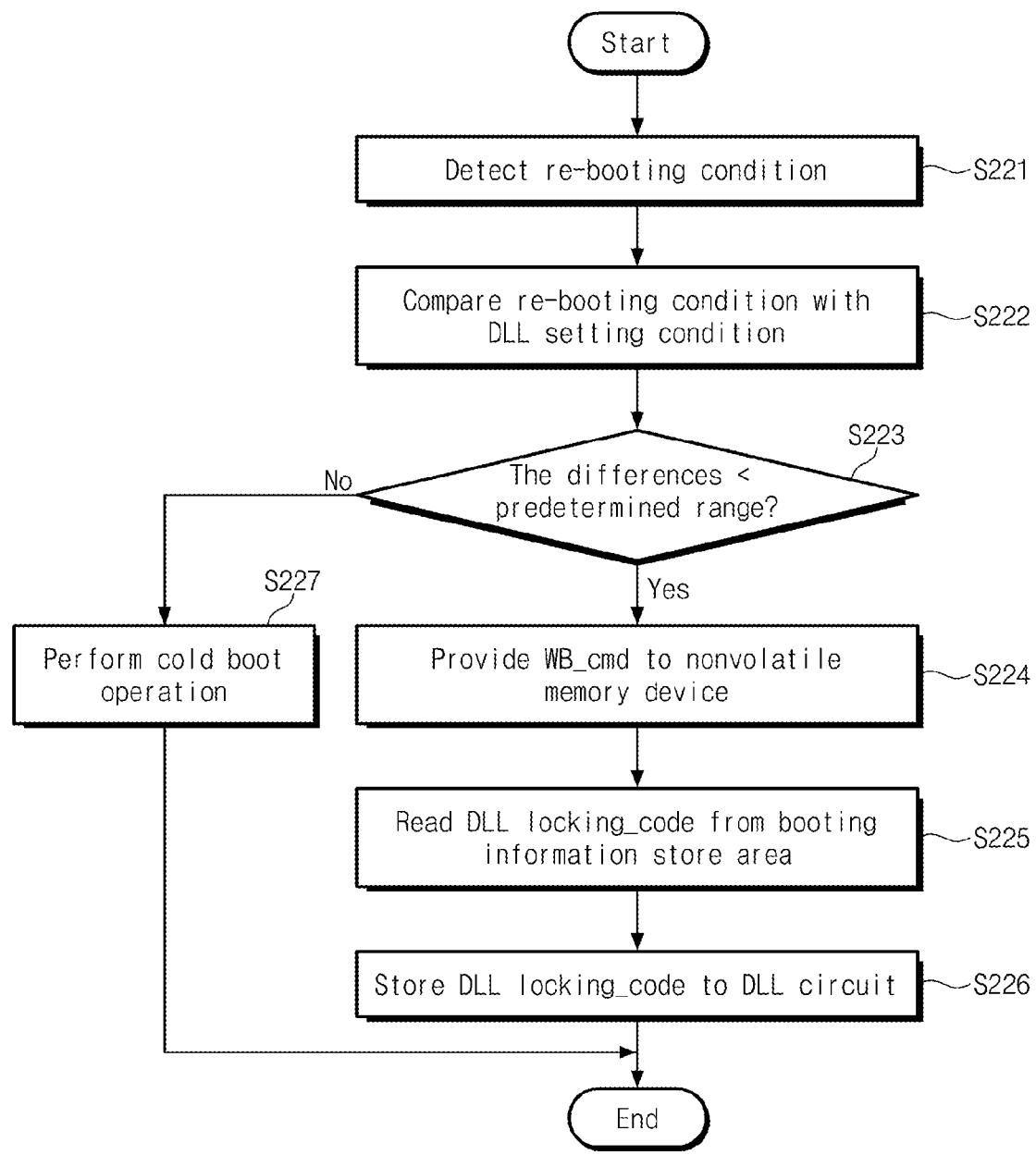

FIGS. 17 and 18 are flow charts illustrating an operating method of a memory system shown in FIG. 16. An operation method of a memory system 3000 in which DLL information is stored at a variable resistance memory will be described with reference to FIGS. 16 and 17. An operating method of the memory system 3000 in which a warm boot operation is performed using DLL information stored at the variable resistance memory will be described with reference to FIGS. 16 and 18.

The solid-lined arrows of FIG. 16 relate to an embodiment in which DLL information is stored at the variable resistance memory. The dashed-lined arrows of FIG. 16 relate to a warm boot operation performed using DLL information stored at the variable resistance memory Referring to FIG. 17, in operation S211, a DLL setting condition may be detected. The condition sensing unit 3120 may sense temperature, time, and voltage conditions to send a detection result to the decision unit 3110 (refer to (1) in FIG. 16). In this case, temperature, time, and voltage conditions when a DLL locking operation is performed may be referred to as a DLL setting condition.

In operation S212, a DLL locking command DLL_cmd may be provided to the nonvolatile memory device 3200. For example, the decision unit 3110 may provide the DLL locking command DLL_cmd to control logic 3250 (refer to (2) in FIG. 16). In this case, the decision unit 3110 may provide information on the DLL setting condition to the control logic 3250 together with the DLL locking command DLL_cmd.

In operation S213, a DLL locking operation may be performed to generate a DLL locking code DLL Locking_code. That is, the control logic 3250 may send the locking start command STRT_cmd to the DLL circuit 3260 in response to the DLL locking command DLL_cmd (refer to (3) in FIG. 16), and the DLL circuit 3260 may perform a DLL locking operation in response to the locking start command STRT_cmd. If the DLL locking operation is completed, the DLL circuit 3260 may generate the DLL locking code DLL Locking_code. Herein, the DLL locking code DLL Locking_code may mean information needed for DLL locking (e.g., optimized timing information for DLL locking).

In operation S214, the DLL locking code DLL Locking_code may be stored at a booting information store area 3211. For example, the DLL locking code DLL Locking_code generated from the DLL circuit 3260 may be stored at the booting information store area 3211 through a write driver 3230 (refer to (4) in FIG. 16). In this case, the control logic 3250 may store information on the DLL setting condition at the booting information store area 3211 together with the booting information store area 3211.

Referring to FIG. 18, in operation S221, a rebooting condition may be detected. For example, the condition sensing unit 3120 may sense a rebooting condition such as a temperature, a time, a voltage, and so on, and may provide information on the rebooting condition to the decision unit 3110 (refer to (a) in FIG. 16).

In operation S222, the rebooting condition may be compared with a DLL setting condition. In operation S223, whether the rebooting condition and the DLL setting condition are contained within a predetermined error range may be determined. For example, the decision unit 3110 may compare the rebooting condition and the DLL setting condition to determine whether the rebooting condition and the DLL setting condition are contained within a predetermined error range. In this case, the decision unit 3110 may receive information associated with the DLL setting condition from the booting information store area 3211.

In the event that the rebooting condition and the DLL setting condition are within the predetermined error range, in operation S224, a warm boot command WB_cmd may be provided to the nonvolatile memory device 3200. For example, in the event that the rebooting condition and the DLL setting condition are within the predetermined error range, the decision unit 3110 may provide the warm boot command WB_cmd to the control logic 3250 (refer to (b) in FIG. 16). In this case, the control logic 3250 may control the nonvolatile memory device 3200 to perform operations S225 and S226.

In operation S225, the DLL locking code DLL Locking_code may be read from the booting information store area 3211. For example, the DLL locking code DLL Locking_code stored at the booting information store area 3211 may be read (refer to (c) in FIG. 16).

In operation S226, the DLL locking code DLL Locking_code may be sent to the DLL circuit 3260. For example, the DLL locking code DLL Locking_code may be transferred to the DLL circuit 3260 from a sense amplifier 3240 (refer to (d) in FIG. 16).

In the event that the warm boot operation is performed, the DLL circuit 3260 may receive the DLL locking code DLL Locking_code from the booting information store area 3211. Thus, the DDL circuit 3260 may perform a DLL locking operation quickly without iteratively performing loops for DLL locking. This may mean that a rebooting operation is performed relatively quickly.

In the event that the rebooting condition and the DLL setting condition are not within to the predetermined error range, in operation S227, a cold boot operation may be performed. The cold boot operation may be performed in the same or substantially the same manner as that described in operations S212 to S214 shown in FIG. 17, and a description thereof is thus omitted here.

Figure 19A:
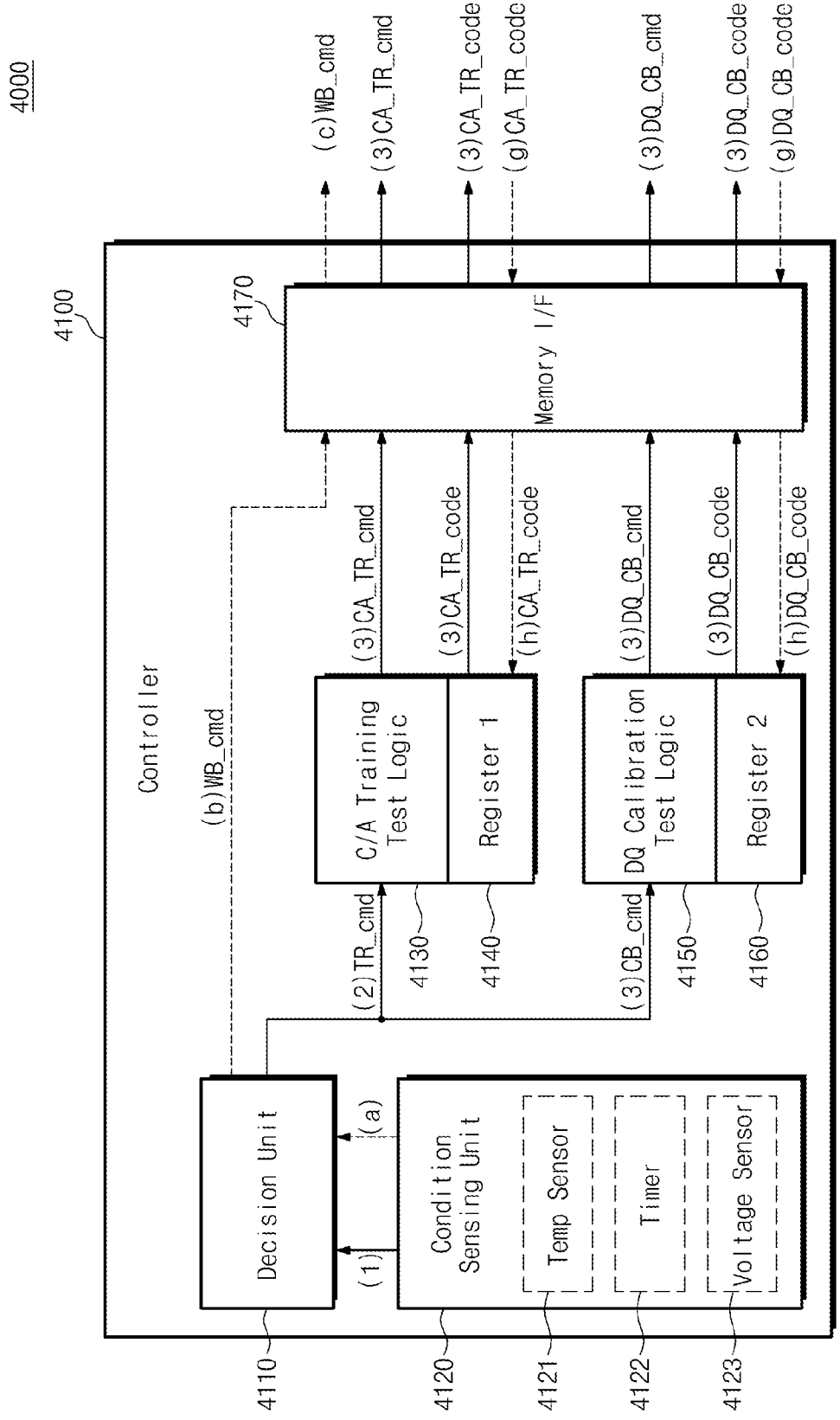
FIGS. 19A and 19B are diagrams schematically illustrating a memory system according to still another embodiment of the inventive concept.
Figure 19B:
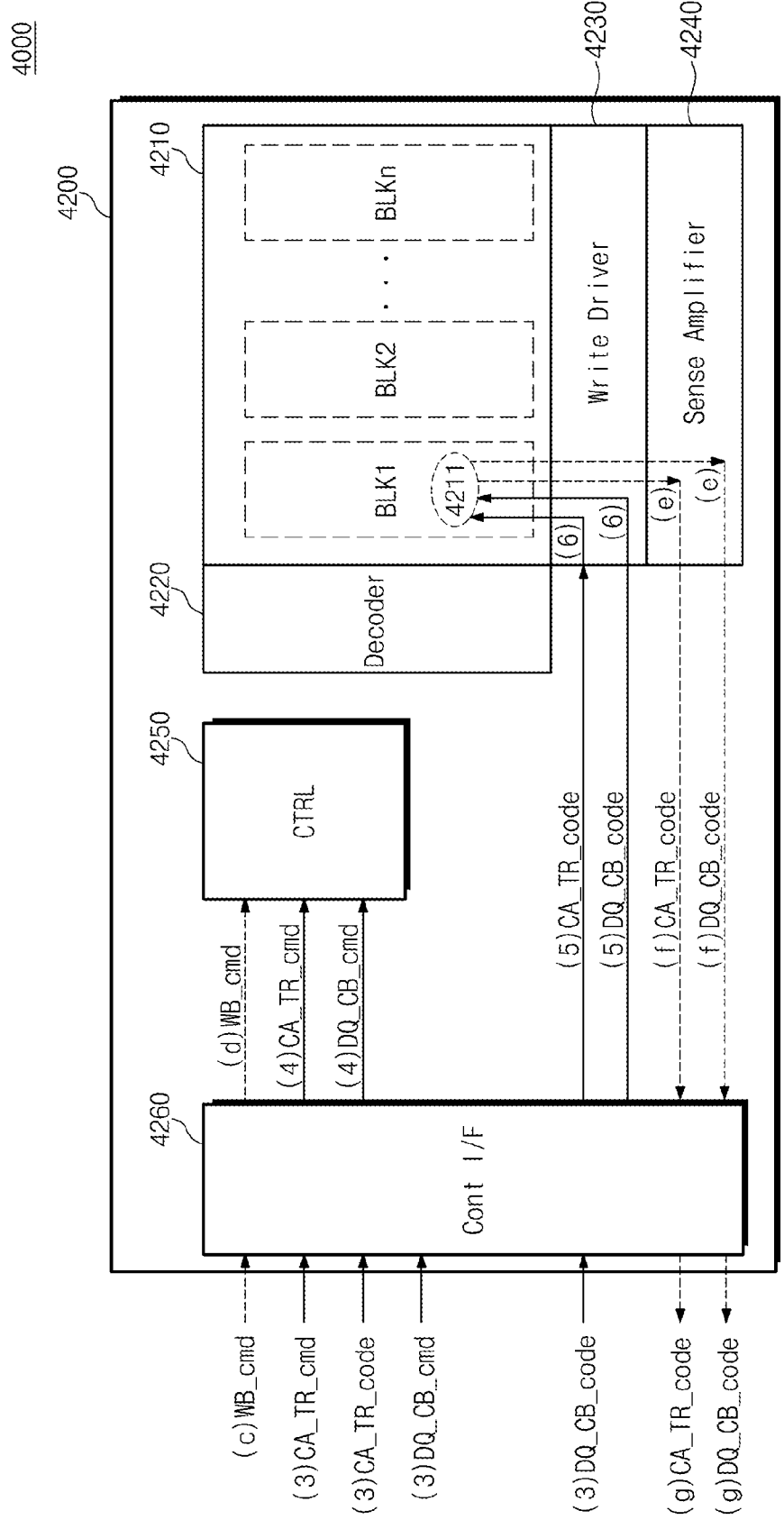

FIGS. 19A and 19B are diagrams schematically illustrating a memory system according to still another embodiment of the inventive concept. An embodiment in which command/address (C/A) training information or DQ calibration information of booting information is stored at a variable resistance memory and a rebooting operation is performed using the C/A training information or the DQ calibration information will be described with reference to FIGS. 19A and 19B.

A memory system 4000 in FIGS. 19A and 19B may be similar to that 2000 shown in FIG. 2. For example, a controller 4100 in FIG. 19A may be similar to a controller 2100 shown in FIG. 2, and a nonvolatile memory device 4200 in shown FIG. 19B may be similar to a nonvolatile memory device 2200 in FIG. 2. The description below primarily focuses on the differences between the memory systems 4000 and 2000, and to avoid redundancy, the same or similar components and operation may are not described again below.

Referring to FIG. 19A, the controller 4100 may include a decision unit 4110, a condition sensing unit 4120, C/A training test logic 4130, a first register 4140, DQ calibration test logic 4150, a second register 4160, and a memory interface 4170.

The condition sensing unit 4120 may sense conditions such as a temperature, a time, a voltage, and so on when a C/A training operation or a DQ calibration operation is performed, and may provide a sensed result to the decision unit 4110. For ease of description, the conditions such as a temperature, a time, a voltage, and so on when a C/A training operation or a DQ calibration operation is performed may be referred to as a training setting condition.

The decision unit 4110 may compare the training setting condition and the rebooting condition to select a warm boot operation or a cold boot operation according a comparing result.

The C/A training test logic 4130 may receive a training command TR_cmd from the decision unit 4110. The C/A training test logic 4130 may perform a C/A training operation in response to the training command TR_cmd. For example, at a cold boot operation, the C/A training test logic 4130 may receive the training command TR_cmd from the decision unit 4110 to perform the C/A training operation.

After the C/A training operation is performed, the C/A training test logic 4130 may generate a C/A training code CA_TR_code to store it at a first register 4140. Herein, the C/A training code CA_TR_code may be indicative of information (e.g., timing information) of a point of time when the C/A training operation is completed.

The C/A training test logic 4130 may provide the memory interface 4170 with the C/A training code CA_TR_code generated by the C/A training operation.

The first register 4140 may store the C/A training code CA_TR_code. For example, in the event that the cold boot operation is performed, the first register 4140 may store the C/A training code CA_TR_code provided from the C/A training test logic 4130. As another example, when a warm boot operation is executed, the first register 4140 may store the C/A training code CA_TR_code provided from a booting information store area 4211 of the nonvolatile memory device 4200 (refer to FIG. 19B).

The DQ calibration test logic 4150 may receive a calibration command CM_cmd from the decision unit 4110. The DQ calibration test logic 4150 may perform a DQ calibration operation in response to the calibration command CM_cmd. For example, in the event that the cold boot operation is performed, the DQ calibration test logic 4150 may perform the DQ calibration operation in response to the calibration command CM_cmd provided from the decision unit 4110.

After the calibration operation is performed, the DQ calibration test logic 4150 may generate a DQ calibration code DQ_CB_code to store it at a second register 4160. Herein, the DQ calibration code DQ_CB_code may be indicative of information (e.g., timing information) of a point of time when the DQ calibration operation is completed.

The DQ calibration test logic 4150 may provide the memory interface 4170 with the DQ calibration code DQ_CB_code generated by the DQ calibration operation.

The second register 4160 may store the DQ calibration code DQ_CB_code. For example, in the event that the cold boot operation is performed, the second register 4160 may store the DQ calibration code DQ_CB_code provided from the DQ calibration test logic 4150. As another example, when the warm boot operation is performed, the second register 4160 may store the DQ calibration code DQ_CB_code provided from the booting information store area 4211 of the nonvolatile memory device 4200.

The memory interface 4170 may provide an interface between the controller 4100 and the nonvolatile memory device 4200.

Referring to FIG. 19B, the nonvolatile memory device 4200 may include a memory cell array 4210, a decoder 4220, a write driver 4230, a sense amplifier 4240, control logic 4250, and a controller interface 4260.

The control logic 4250 may receive the C/A training command CA_TR_cmd or the DQ calibration command DQ_CM_cmd from the controller interface 4260. The control logic 4250 may control the nonvolatile memory device 4200 in response to the C/A training command CA_TR_cmd or the DQ calibration command DQ_CM_cmd such that the C/A training code CA_TR_code or the DQ calibration code DQ_CM_code is stored at the booting information store area 4211 of the memory cell array 4210.

In the event that the warm boot operation is performed, the control logic 4250 may receive a warm boot command WB_cmd from the controller interface 4260. The control logic 4250 may control the nonvolatile memory device 4200 in response to the warm boot command WB_cmd to read the C/A training code CA_TR_code or the DQ calibration code DQ_CM_code stored at the booting information store area 4211. The read C/A training code CA_TR_code or DQ calibration code DQ_CM_code may be provided to the controller 4100 through the controller interface 4260.

Figure 20:
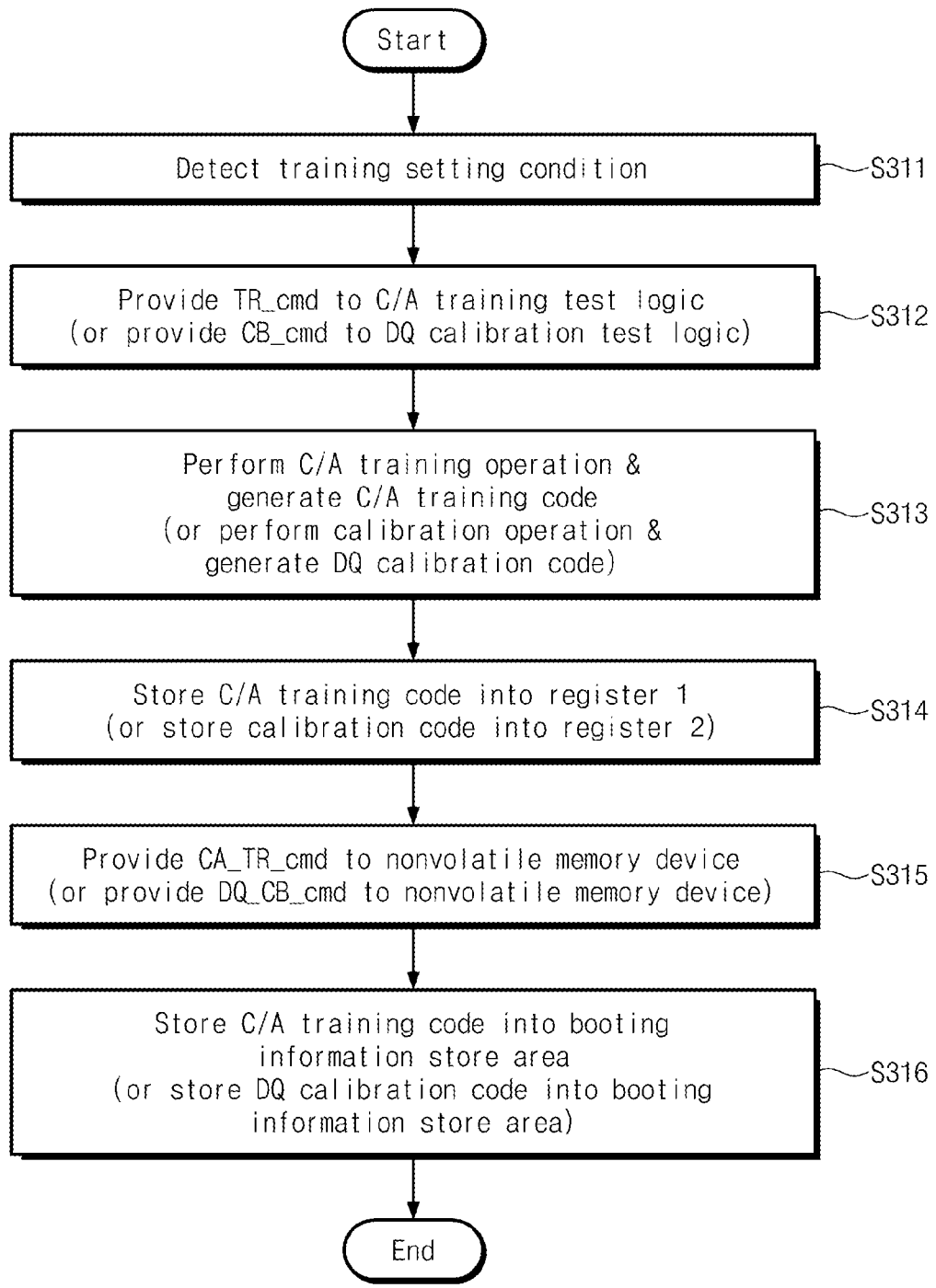
FIGS. 20 and 21 are flow charts illustrating an operating method of a memory system shown in FIGS. 19A and 19B.
Figure 21:
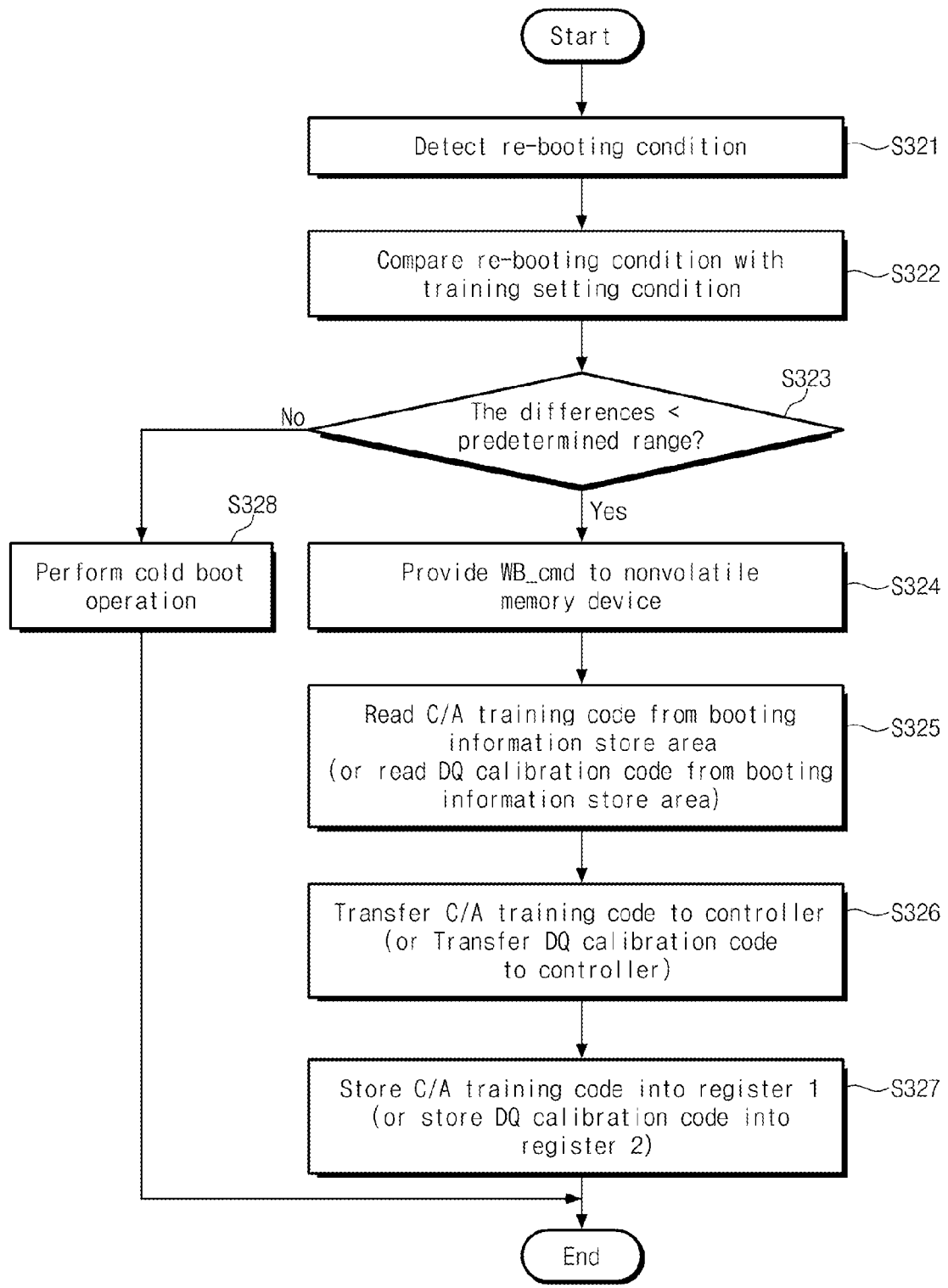

FIGS. 20 and 21 are flow charts illustrating an operating method of a memory system in FIGS. 19A and 19B. An operating method of a memory system 4000 in which C/A training information or DQ calibration information is stored at a variable resistance memory will be described with reference to FIG. 20. An operating method of the memory system 4000 in which a warm boot operation is performed using the C/A training information or DQ calibration information stored at the variable resistance memory will be described with reference to FIG. 21.

The solid-lined arrows of FIGS. 19A and 19B relate to an embodiment in which C/A training information or DQ calibration information is stored at the variable resistance memory. The dashed-lined arrows of FIGS. 19A and 19B relate to an embodiment in which the warm boot operation is performed using the C/A training information or DQ calibration information stored at the variable resistance memory.

Referring to FIG. 20, in operation S311, training setting conditions may be detected. For example, a condition sensing unit may detect the training setting conditions such as a voltage, a temperature, time, and so on, and may provide a detection result to a decision unit 4110 (refer to (a) in FIG. 19A).

In operation S312, a training command TR_cmd may be provided to C/A training test logic 4130. For example, the decision unit 4110 may provide the training command TR_cmd to C/A training test logic 4130 (refer to (2) in FIG. 19A).

In operation S313, a C/A training operation may be performed. A C/A training code CA_TR_code may be generated as a result of the C/A training operation. The C/A training test logic 4130 may perform a C/A training operation in response to the training command TR_cmd. After the C/A training operation is performed, the C/A training test logic 4130 may generate the C/A training code CA_TR_code.

In operation S314, the C/A training code CA_TR_code may be provided to a first register 4140. For example, the C/A training test logic 4130 may store the C/A training code CA_TR_code at the first register 4140.

In operation S315, a C/A training command CA_TR_cmd may be provided to a nonvolatile memory device 4200. For example, the C/A training test logic 4130 may provide a memory interface 4140 with the C/A training command CA_TR_cmd and the C/A training code CA_TR_code (refer to (3) in FIG. 19A), and the memory interface 4140 may provide a controller interface 4260 with the C/A training command CA_TR_cmd and the C/A training code CA_TR_code (refer to (3) in FIG. 19B).

In operation S316, the C/A training code CA_TR_code may be stored at a booting information store area 4211. For example, control logic 4250 may store the C/A training code CA_TR_code at the booting information store area 4211 of a memory cell array 4210 in response to the C/A training command CA_TR_cmd (refer to (4), (5), and (6) in FIG. 19B).

An operation in which a DQ calibration code DQ_CB_code is generated and stored may be performed the same as an operation in which the C/A training code CA_TR_code is generated and stored, which will be more fully described below.

The decision unit 4110 may provide the calibration command CB_cmd to DQ calibration test logic 4150 (refer to (2) in FIG. 19A). The DQ calibration test logic 4150 may perform a DQ calibration operation in response to the calibration command CB_cmd. After the calibration operation is completed, the DQ calibration test logic 4150 may store a DQ calibration code DQ_CB_code at a second register 4160.

The DQ calibration test logic 4150 may provide the memory interface 4140 with the DQ calibration command DQ_CB_cmd and the DQ calibration code DQ_CB_code (refer to (3) in FIG. 19A), and the memory interface 4140 may provide the DQ calibration command DQ_CB_cmd and the DQ calibration code DQ_CB_code to the controller interface 4250 (refer to (3) in FIG. 19B).

Afterwards, the control logic 4250 may store the DQ calibration code DQ_CB_code at the booting information store area 4211 of the memory cell array in response to the DQ calibration command DQ_CB_cmd (refer to (4), (5), and (6) in FIG. 19B).

Meanwhile, the operation in which a DQ calibration code DQ_CB_code is generated and stored may be performed at the same time with the operation in which the C/A training code CA_TR_code is generated and stored. Alternatively, the operation in which a DQ calibration code DQ_CB_code is generated and stored and the operation in which the C/A training code CA_TR_code is generated and stored may be performed at different times.

Referring to FIG. 21, in operation S321, a rebooting condition may be detected. For example, the condition sensing unit 4120 may detect rebooting conditions such as a temperature, a time, a voltage, and so on, and may provide the decision unit 4110 with information associated with the rebooting condition (refer to (a) in FIG. 19A).

In operation S322, the rebooting condition may be compared with a training setting condition. In operation S323, whether the rebooting condition and the training setting condition are contained within a predetermined error range may be determined. For example, the decision unit 4110 may compare the rebooting condition with the training setting condition to determine whether the rebooting condition and the training setting condition are contained within a predetermined error range. In this case, the decision unit 4110 may receive information associated with the training setting condition from the booting information store area 4211.

In the event that the rebooting condition and the training setting condition are within the predetermined error range, in operation S324, a warm boot command WB_cmd may be provided to the nonvolatile memory device 4200. For example, if the rebooting condition and the training setting condition are within the predetermined error range, the decision unit 4110 may provide the warm boot command WB_cmd to the nonvolatile memory device 4200 (refer to (b) in FIG. 19A). The memory interface 4170 may provide the controller interface 4260 with the warm boot command WB_cmd (refer to (c) in FIG. 19A), and the controller interface 4260 may provide the warm boot command WB_cmd to the control logic 4250 (refer to (d) in FIG. 19B).

In operation S325, the C/A training code CA_TR_code may be read out from the booting information store area 4211. For example, the control logic 4250 may control the nonvolatile memory device 4200 in response to the warm boot command WB_cmd such that the C/A training code CA_TR_code stored at the booting information store area 4211 is read. In this case, the C/A training code CA_TR_code may be read through a sense amplifier 4240 (refer to (e) in FIG. 19B).

In operation S326, the C/A training code CA_TR_code may be sent to the controller 4100. For example, the C/A training code CA_TR_code may be transferred to the controller interface 4260 (refer to (f) in FIG. 19B), and the controller interface 4260 may provide the C/A training code CA_TR_code to the memory interface (refer to (g) in FIG. 19B).

In operation S327, the C/A training code CA_TR_code may be stored at the first register 4140. For example, the memory interface 4170 may provide the C/A training code CA_TR_code to the first register 4140 (refer to (h) in FIG. 19A), and the first register 4140 may store the C/A training code CA_TR_code. In the event that the warm boot operation is performed, the C/A training test logic 4130 may obtain the C/A training code CA_TR_code without performing a C/A training operation.

At the warm boot operation, the DQ calibration test logic 4150 may acquire a DQ calibration code in the same manner as described with reference to operations S321 to S327.

In the event that the rebooting condition and the training setting condition are contained within a predetermined error range, the control logic 4250 may control the nonvolatile memory device 4200 in response to the warm boot command WB_cmd such that the DQ calibration code DQ_CB_code is read out.

In this case, the DQ calibration code DQ_CB_code may be read through the sense amplifier 4240 (refer to (e) in FIG. 19B), and the DQ calibration code DQ_CB_code may be provided to the controller interface 4260 (refer to (f) in FIG. 19B). The controller interface 4260 may provide the DQ calibration code DQ_CB_code to the memory interface 4170 (refer to (g) in FIG. 19B). Afterwards, the memory interface 4170 may provide the DQ calibration code DQ_CB_code to the second register 4160 (refer to (h) in FIG. 19B), and the second register 4160 may store the DQ calibration code DQ_CB_code.

In the event that the warm boot operation is performed, the DQ calibration test logic 4150 may acquire the DQ calibration code without performing the DQ calibration operation.

As a result, the memory system 4000 may perform a rebooting operation relatively quickly by skipping the C/A training operation and the DQ calibration operation.

Figure 22:
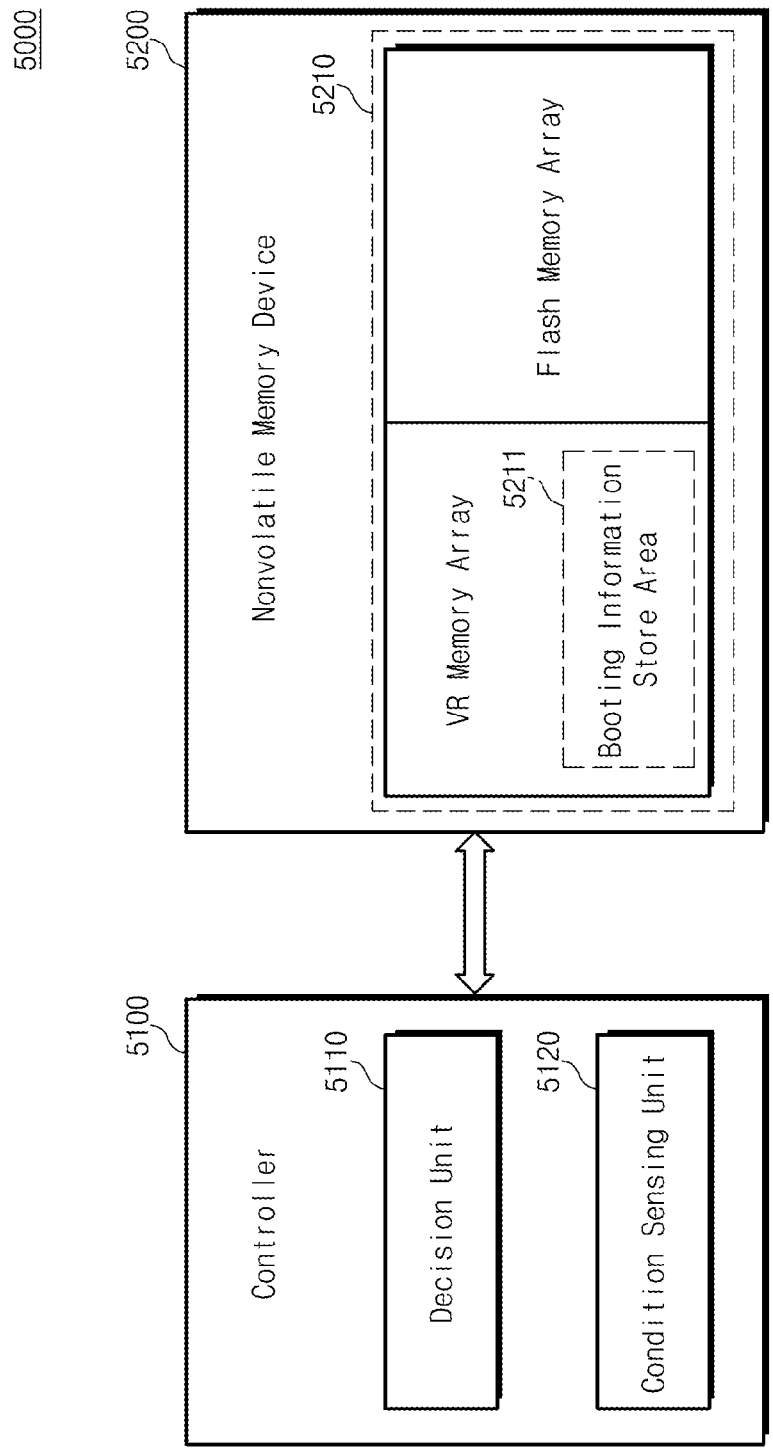
FIG. 22 is a block diagram schematically illustrating a memory system according to another embodiment of the inventive concept.

FIG. 22 is a block diagram schematically illustrating a memory system according to another embodiment of the inventive concept. A memory system 5000 shown in FIG. 22 may be similar to the memory system 1000 in FIG. 1, and to avoid redundancy, the description below primarily focuses on the differences between the two memory systems 1000 and 5000.

Referring to FIG. 22, the memory system 5000 may include a controller 5100 and a nonvolatile memory device 5200. The controller 5100 may include a decision unit 5110 and a condition sensing unit 5120, and the nonvolatile memory device 5200 may include a memory array 5210.

The memory array 5210 may include a variable resistance memory array and a flash memory array. That is, unlike a memory array shown in FIG. 1, the memory array 5210 shown in FIG. 22 may be implemented by different types of memory cells.

In FIG. 22, there is exemplarily illustrated an example in which the memory array 5210 is formed of a variable resistance memory and a flash memory. However, the inventive concept is not limited thereto. For example, the flash memory may be replaced with other types of memory such as PRAM, RRAM, and so on.

Figure 23:
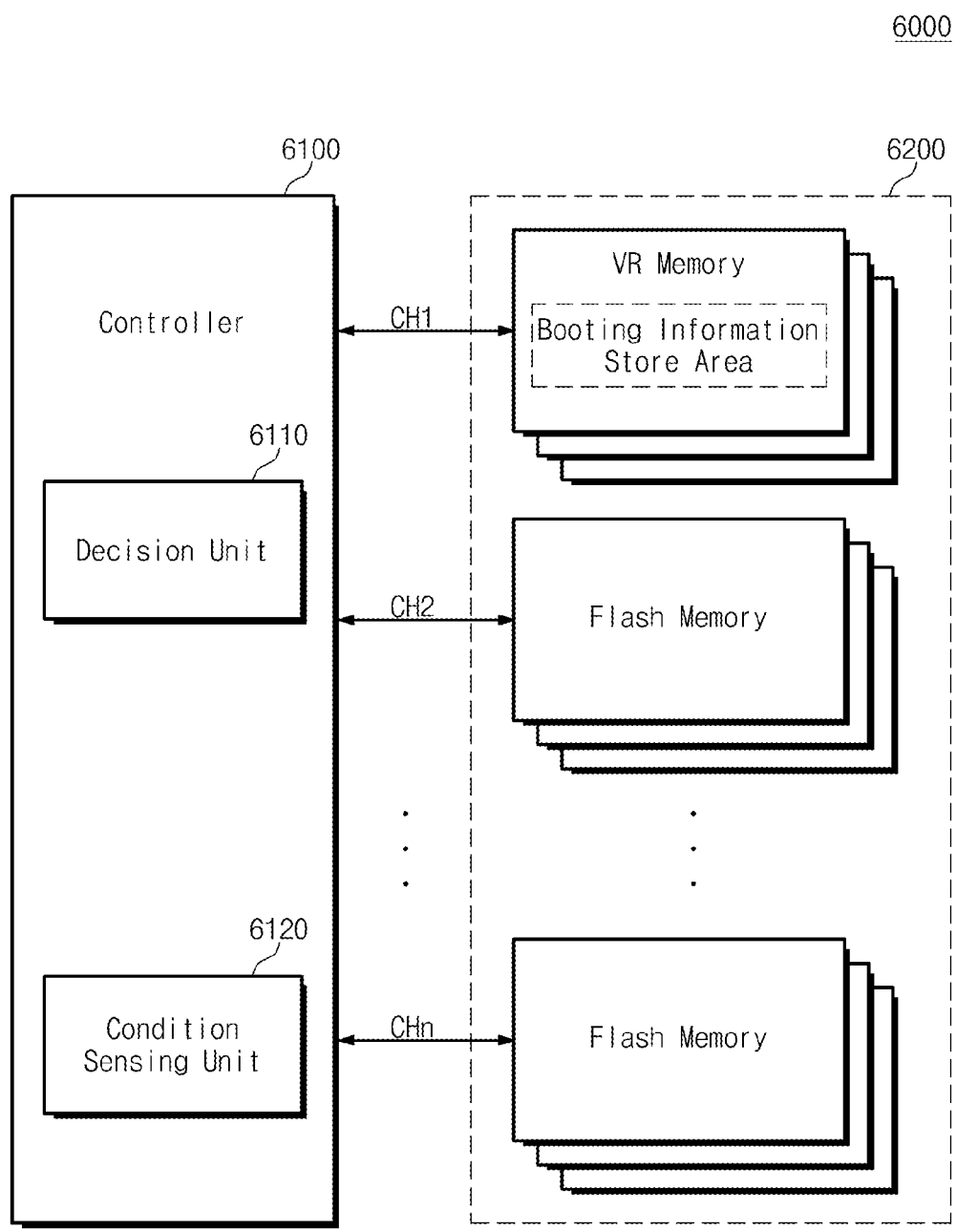
FIG. 23 is a block diagram schematically illustrating an application of a memory system shown in FIG. 1.

FIG. 23 is a block diagram schematically illustrating an application of a memory system shown in FIG. 1. It was assumed that a nonvolatile memory device described with reference to FIGS. 1 to 22 is formed of a nonvolatile memory chip. However, the inventive concept is not limited thereto. For example, the inventive concept may be applied to a case in which a plurality of nonvolatile memory chips is used.

Referring to FIG. 23, a memory system 6000 may include a controller 6100 and a storage device 6200. The storage device 6200 may include a plurality of nonvolatile memory chips, which are divided into a plurality of groups.

Nonvolatile memory chips in each group may be configured to communicate with the controller through one common channel. In FIG. 23, there is illustrated an example in which a plurality of nonvolatile memory chips communicates with the controller 6100 through a plurality of channels CH1 to CHn.

Variable resistance memory chips may communicate with the controller 6100 through the channel CH1. Flash memory chips may communicate with the controller 6100 through the channels CH2 to CHn. The variable resistance memory chip may be configured the same or substantially the same as a nonvolatile memory device described with reference to FIGS. 1 to 22. The controller 6100 may be configured the same or substantially the same as a controller described with reference to FIGS. 1 to 22.

Figure 24:
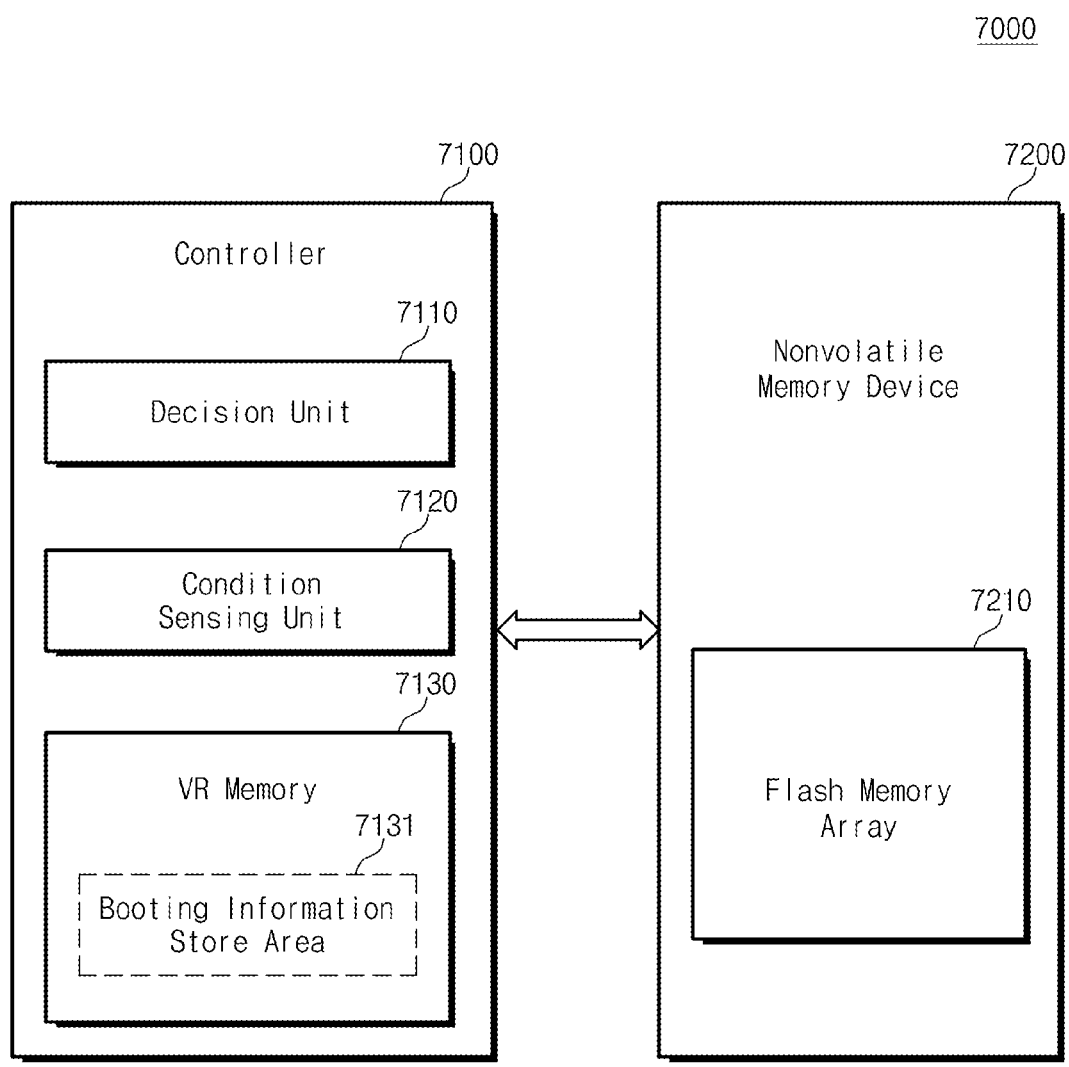
FIG. 24 is a block diagram schematically illustrating a memory system according to still another embodiment of the inventive concept.

FIG. 24 is a block diagram schematically illustrating a memory system according to still another embodiment of the inventive concept. Memory systems described with reference to FIGS. 1 to 23 may include a nonvolatile memory device, and booting information may be stored at the nonvolatile memory device. As illustrated in FIG. 24, however, a controller 7100 may include a variable resistance memory 7130, and booting information may be stored at the variable resistance memory 7130 of the controller 7100.

Referring to FIG. 24, a memory system 7000 may include a controller 7100 and a nonvolatile memory device 7200. The controller 7100 may include a decision unit 7110, a condition sensing unit 7120, and a variable resistance memory 7130, and the nonvolatile memory device 7200 may include a flash memory array 7210.

As illustrated in FIG. 24, the variable resistance memory 7130 may be included in the controller 7100, and booting information may be stored at a booting information store area 7131 of the variable resistance memory 7130. Thus, when a rebooting operation is performed, the memory system 7000 may perform a warm boot operation using the booting information in the controller 7100.

The nonvolatile memory device 7200 may be implemented by a variety of memories. In FIG. 24, there is illustrated an example in which the nonvolatile memory device 7200 is formed of a flash memory. However, the inventive concept is not limited thereto. For example, the nonvolatile memory device 7200 may be implemented by other types of memory such as PRAM, RRAM, DRAM, MRAM, and so on. Further, the nonvolatile memory device 7200 may be implemented by a plurality of nonvolatile memory chips as illustrated in FIG. 23.

Figure 25:
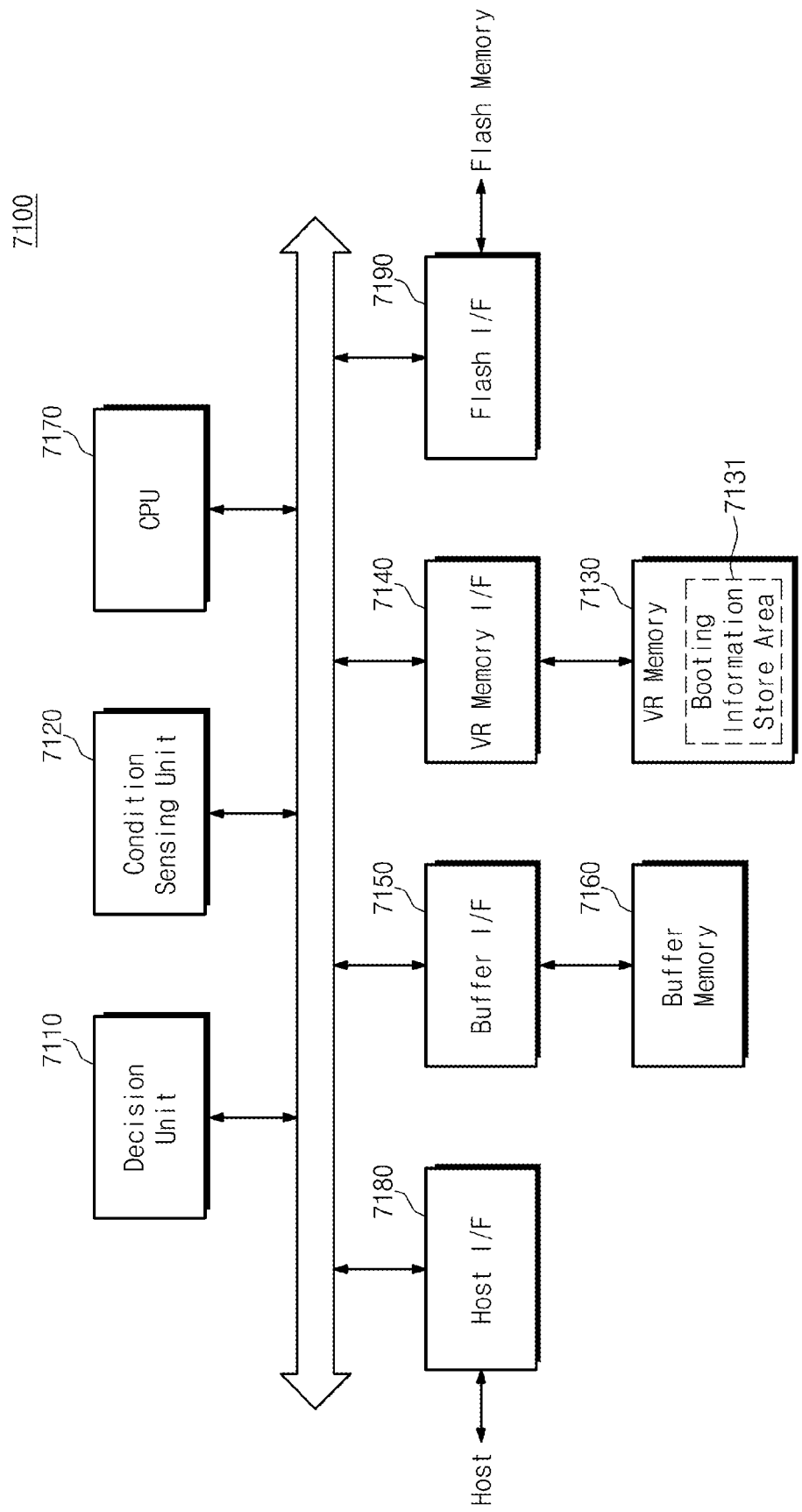
FIG. 25 is a block diagram illustrating a controller shown in FIG. 24.

FIG. 25 is a block diagram illustrating a controller shown in FIG. 24. Referring to FIG. 25, a controller 7100 may include a decision unit 7110, a condition sensing unit 7120, a variable resistance memory 7130, a variable resistance memory interface 7140, a buffer interface 7150, a buffer memory 7160, a CPU 7170, a host interface 7180, and a flash interface 7190.

The host interface 7180 may be configured to provide an interface between the controller 7100 and an external host. The flash interface 7190 may be configured to provide an interface between the controller 7100 and a nonvolatile memory device 7200. The variable resistance memory interface 7140 may provide an interface between the variable resistance memory 7131 and the decision unit 7110. For example, in the event that the variable resistance memory 7131 is formed of MRAM, the variable resistance memory interface 7140 may be configured according to a DRAM protocol.

The variable resistance memory 7130 may include a booting information store area 7131, and booting information needed for a warm boot operation may be stored at the booting information store area 7131. For example, booting information described with reference to FIGS. 1 to 23 may be stored at the booting information store area 7131.

The variable resistance memory 7130 may communicate with the decision unit 7110 and the condition sensing unit 7120 through the variable resistance memory interface 7140. In this case, the decision unit 7110 and the condition sensing unit 7120 may be configured the same or substantially the same as those described with reference to FIGS. 1 to 23.

Figure 26:
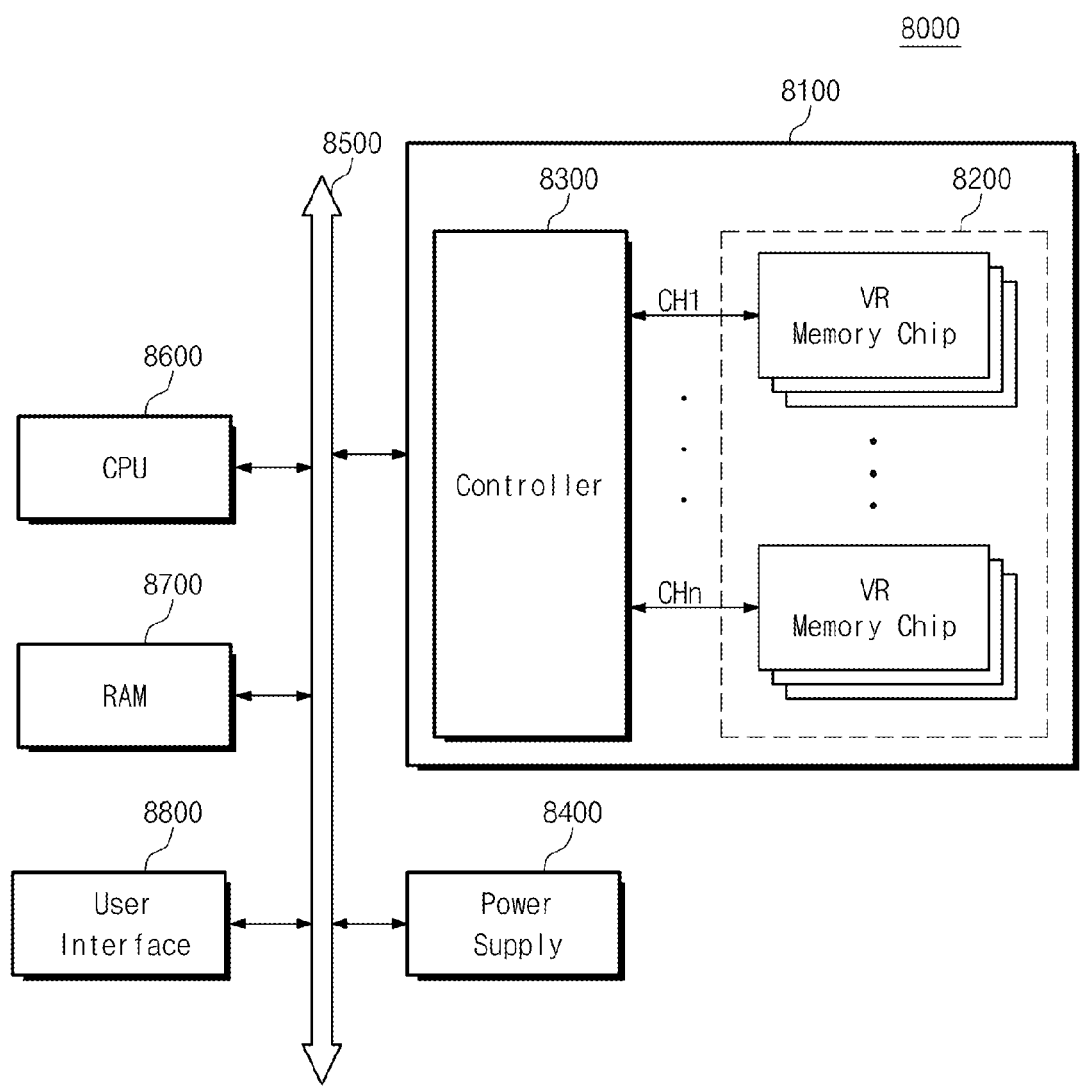
FIG. 26 is a block diagram schematically illustrating a computing system including a memory system according to an embodiment of the inventive concept.

FIG. 26 is a block diagram schematically illustrating a computing system including a memory system according to an embodiment of the inventive concept. Referring to FIG. 26, a computing system 8000 may include a CPU 8600, a RAM 8700, a user interface 8800, a power supply 8400, and a memory system 8100.

The memory system 8100 may be electrically connected with the components 8400, 8600, 8700, and 8800 through a system bus 8500. Data provided through the user interface 8800 or processed by the CPU 8600 may be stored at the memory system 8100. The memory system 8100 may include a controller 8200 and a nonvolatile memory device 8300.

In example embodiments, the memory system 8100 may include a plurality of nonvolatile memory chips. Some of the memory chips may be formed of variable resistance memory chips. However, the inventive concept is not limited thereto. For example, the memory system 8100 may be replaced with one of memory systems illustrated in FIGS. 1 to 25.

Figure 27:
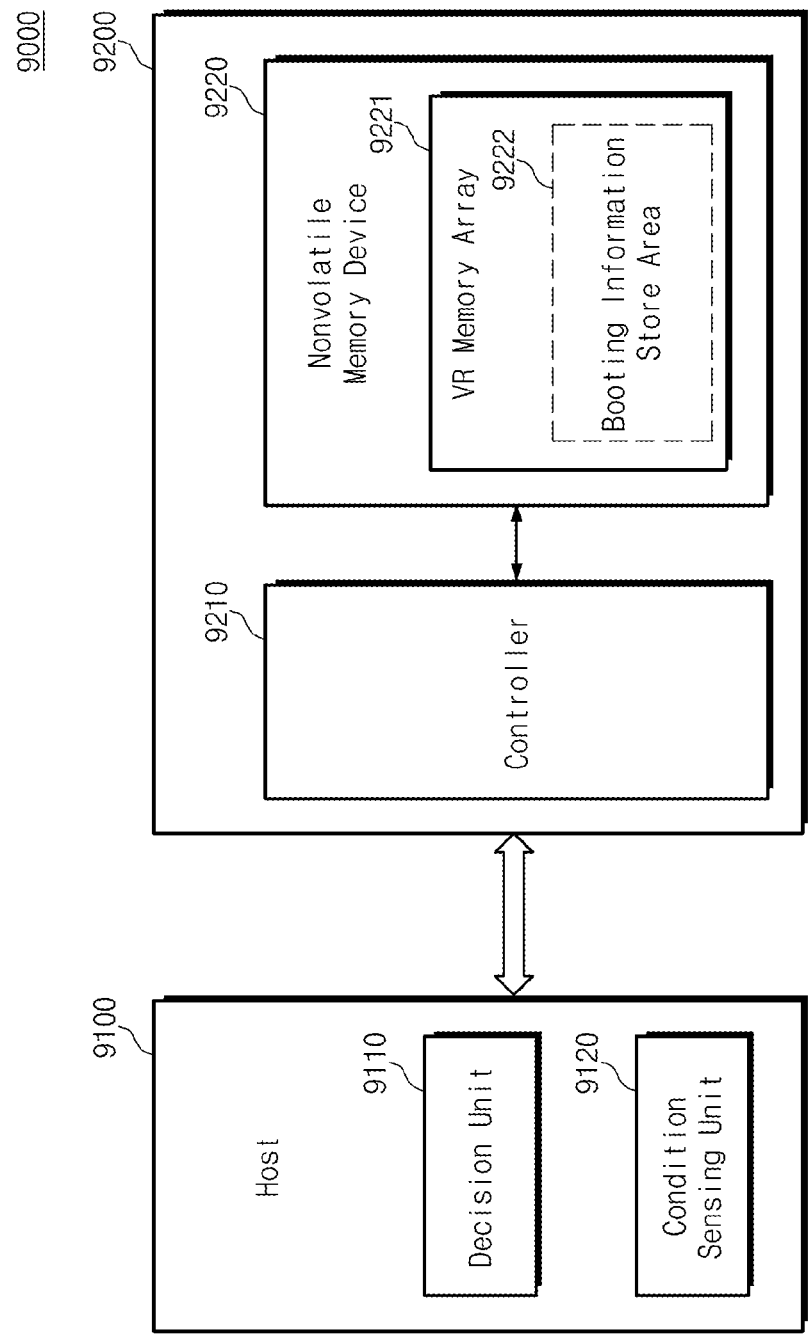
FIG. 27 is a block diagram schematically illustrating another application of a memory system according to an embodiment of the inventive concept.

FIG. 27 is a block diagram schematically illustrating another application of a memory system according to an embodiment of the inventive concept.

Each of memory systems described with reference to FIGS. 1 to 26 may include a decision unit and a condition sensing unit, and may decide whether to perform a warm or cold boot operation independently from a host. As illustrated in FIG. 27, however, a host 9100 may include a decision unit 9110 and a condition sensing unit 9120, and may perform operations of sensing a booting setting condition and a rebooting condition and comparing the conditions.

Referring to FIG. 27, a user device 9000 may include a host 9100 and a memory system 9200. The host 9110 may include the decision unit 9110 and the condition sensing unit 9120, and the memory system 9200 may include a controller 9210 and a nonvolatile memory device 9220. The nonvolatile memory device 9220 may include a variable resistance memory array 9221 and a booting information store area 9222.

In example embodiments, the host 9100 may be an electronic device such as a cellular phone, a smart phone, a tablet PC, a personal computer, a digital camera, and so on. The memory system 9200 may be a memory card, an external HDD, a solid state disk (SSD), and so on which is mounted at the host 9100.

As illustrated in FIG. 27, the host 9100 may perform operations of determining whether to perform a warm boot operation and sensing a booting setting condition and a rebooting condition using the decision unit 9110 and the condition sensing unit 9120.

In FIG. 27, there is exemplarily illustrated an example in which the nonvolatile memory device 9220 includes a variable resistance memory and a booting information store area. However, the inventive concept is not limited thereto. For example, the host 9100 may be configured to include a variable resistance memory and a booting information store area.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:
1. A storage device comprising:
   a nonvolatile memory device including a variable resistance memory; and
   a controller configured to control the nonvolatile memory device,
   wherein at a booting operation, the controller stores booting information in the variable resistance memory of the nonvolatile memory device,
   wherein at a rebooting operation, the controller selectively performs a warm boot operation using the booting information stored in the variable resistance memory, based on a comparison result between a booting setting condition associated with the booting operation and a rebooting condition associated with the rebooting operation, and
   wherein the controller includes a condition sensing unit configured to sense information of the booting setting condition associated with the booting operation, and to sense information of the rebooting condition associated with the rebooting operation.

2. The storage device of claim 1, wherein the controller further includes:
   a decision unit configured to compare the booting setting condition and the rebooting condition, and to determine whether to perform the warm boot operation according to the comparison result.

3. The storage device of claim 2, wherein when the booting setting condition and the rebooting condition are contained within a predetermined error range, the decision unit controls the nonvolatile memory device to perform the warm boot operation using the booting information stored in the variable resistance memory.

4. The storage device of claim 3, wherein the decision unit updates the booting information when the booting setting condition and the rebooting condition are not contained within the predetermined error range, and controls the nonvolatile memory device such that the booting information of the variable resistance memory is overwritten by the updated booting information.

5. The storage device of claim 3, wherein the booting setting condition is stored in the variable resistance memory at the booting operation, and
wherein, at the rebooting operation, when the booting setting condition and the rebooting condition are not within the predetermined error range, the decision unit controls the nonvolatile memory device such that the booting setting condition stored in the variable resistance memory is overwritten by the rebooting condition.

6. The storage device of claim 1, wherein the condition sensing unit comprises:
a temperature sensor sensing information associated with a temperature at the booting operation;
a timer checking information associated with a time at the booting operation; and
a voltage sensor sensing information associated with a voltage at the booting operation.

7. The storage device of claim 1, wherein the nonvolatile memory device further comprises a mode register set (MRS) to store MRS information, and
wherein, at the booting operation, the controller stores the MRS information in the mode register set and the variable resistance memory when the booting information is set.

8. The storage device of claim 7, wherein the nonvolatile memory device further comprises control logic to control the mode register set and the variable resistance memory, and
wherein the control logic transfers the MRS information stored in the variable resistance memory to the mode register set when the warm boot operation is performed.

9. The storage device of claim 1, wherein the nonvolatile memory device further comprises:
a delayed locked loop (DLL) circuit configured to perform a DLL locking operation at the booting operation; and
control logic configured to control the variable resistance memory and the DLL circuit, and
wherein after the DLL locking operation is completed, the control logic stores information associated with a DLL locking result in the variable resistance memory.

10. The storage device of claim 9, wherein the control logic transfers information associated with the DLL locking result stored in the variable resistance memory to the DLL circuit when the warm boot operation is performed.

11. The storage device of claim 1, wherein the controller comprises:
command/address (C/A) training test logic configured to perform a C/A training operation at the booting operation; and
a register configured to store a C/A training result after the C/A training operation is completed.

12. The storage device of claim 11, wherein the controller stores the C/A training result in the variable resistance memory.

13. The storage device of claim 12, wherein the controller sends the C/A training result stored in the variable resistance memory to the register when the warm boot operation is performed.

14. The storage device of claim 1, wherein the controller comprises:
input/output data (DQ) calibration test logic configured to perform a DQ calibration operation at the booting operation; and
a register configured to store a DQ calibration result after the DQ calibration operation is completed.

15. The storage device of claim 14, wherein the controller stores the DQ calibration result in the variable resistance memory.

16. The storage device of claim 15, wherein the controller sends the DQ calibration result stored in the variable resistance memory to the register when the warm boot operation is performed.

17. The storage device of claim 1, wherein the nonvolatile memory device further comprises a flash memory, and
wherein the variable resistance memory stores the booting information and the flash memory stores user data.

18. The storage device of claim 1, wherein the nonvolatile memory device further comprises a plurality of flash memories, and
wherein the variable resistance memory is connected with the controller via a first channel and the plurality of flash memories is connected with the controller via at least one second channel that is different from the first channel.

19. The storage device of claim 1, wherein the variable resistance memory is a magneto resistive random access memory (MRAM).

20. A storage device comprising:
a nonvolatile memory device configured to store user data; and
a controller configured to control the nonvolatile memory device and including a variable resistance memory,
wherein, at a booting operation, booting information and a booting setting condition are stored in the variable resistance memory of the controller,
wherein, at a rebooting operation, the controller selectively performs a warm boot operation using the booting information stored in the variable resistance memory, based on a comparison result between a rebooting condition detected at the rebooting operation and the booting setting condition stored at the booting operation, and
wherein the booting information is at least one of mode register set (MRS) information, delayed locked loop (DLL) locking information, command/address (C/A) training information, or input/output data (DQ) calibration information.

21. The storage device of claim 20, wherein the controller further comprises:
a condition sensing unit configured to sense the booting setting condition at the booting operation and to sense the rebooting condition at the rebooting operation; and
a decision unit configured to compare the booting setting condition and the rebooting condition.

22. The storage device of claim 21, wherein the nonvolatile memory device includes a flash memory, and the variable resistance memory of the controller includes an magneto resistive random access memory (MRAM), and
wherein the controller further comprises:
a host interface configured to interface with a host;
a flash memory interface configured to interface with the flash memory; and a dynamic random access memory (DRAM) interface configured to provide an interface between the decision unit and the MRAM according to a DRAM interface protocol.

23. An operating method of a storage device which includes a variable resistance memory, comprising:
   detecting a rebooting condition corresponding to a rebooting operation;
   comparing the rebooting condition with a booting setting condition stored in the variable resistance memory, the booting setting condition corresponding to a booting operation executed before the rebooting operation; and
   utilizing booting information, set in the variable resistance memory during the booting operation, at the rebooting operation when the rebooting condition and the booting setting condition are contained within a predetermined error range,
   wherein the comparing the rebooting condition with a booting setting condition comprises comparing one of temperature information, voltage information, and time information at the rebooting operation with one of temperature information, voltage information, and time information at the booting operation.

24. The operating method of claim 23, wherein the utilizing booting information comprises:
   reading mode register set (MRS) setting information from the variable resistance memory; and
   storing the read MRS setting information in a mode register set.

25. The operating method of claim 23, wherein the utilizing booting information comprises:
   reading delayed lock loop (DLL) locking information from the variable resistance memory; and
   sending the read DLL locking information to a DLL circuit.

26. The operating method of claim 23, wherein the utilizing booting information comprises:
   reading a command/address (C/A) training code from the variable resistance memory;
   storing the read C/A training code in a register corresponding to C/A training test logic.

27. The operating method of claim 23, wherein the utilizing booting information comprises:
   reading an input/output data (DQ) calibration code from the variable resistance memory; and
   storing the read DQ calibration code at a second register corresponding to DQ calibration test logic.

* * * * *